US012610697B2

(12) United States Patent
Kang et al.

(10) Patent No.: US 12,610,697 B2
(45) Date of Patent: Apr. 21, 2026

(54) DISPLAY DEVICE

(71) Applicant: Samsung Display Co., Ltd., Yongin-si (KR)

(72) Inventors: Ki Nyeng Kang, Yongin-si (KR); Guanghai Jin, Yongin-si (KR); Sunkwang Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 447 days.

(21) Appl. No.: 18/101,045

(22) Filed: Jan. 24, 2023

(65) Prior Publication Data

US 2023/0389368 A1 Nov. 30, 2023

(30) Foreign Application Priority Data

May 30, 2022 (KR) ........................ 10-2022-0065970

(51) Int. Cl.
| | |
|---|---|
| *H10K 59/124* | (2023.01) |
| *H10K 59/131* | (2023.01) |
| *H10K 59/40* | (2023.01) |
| *H10K 59/88* | (2023.01) |
| *H10K 102/00* | (2023.01) |

(52) U.S. Cl.
CPC ......... *H10K 59/124* (2023.02); *H10K 59/131* (2023.02); *H10K 59/40* (2023.02); *H10K 59/88* (2023.02); *H10K 2102/311* (2023.02)

(58) Field of Classification Search
None
See application file for complete search history.

(56) References Cited

U.S. PATENT DOCUMENTS

| | | | |
|---|---|---|---|
| 7,515,406 | B2 | 4/2009 | Kee et al. |
| 9,639,121 | B2 | 5/2017 | Min et al. |
| 10,916,718 | B2 | 2/2021 | Ding |
| 12,171,115 | B2 | 12/2024 | Jung et al. |

(Continued)

FOREIGN PATENT DOCUMENTS

| | | |
|---|---|---|
| CN | 109920332 A | 6/2019 |
| CN | 111524902 A | 8/2020 |

(Continued)

OTHER PUBLICATIONS

Kim, Mijung, et al., "Fully-integrated, bezel-less transistor arrays using reversibly foldable interconnects and stretchable origami substrates," Nanoscale, The Royal Society of Chemistry, 2016, 7 pages.

(Continued)

*Primary Examiner* — Kyoung Lee

(74) *Attorney, Agent, or Firm* — Womble Bond Dickinson (US) LLP

(57) ABSTRACT

A display device includes: a substrate including a first portion, a second portion, and a folding portion between the first and second portions; a plurality of transistors on the substrate, and located on at least the first and second portions; a plurality of inorganic insulating layers extending on the first and second portions to cover a semiconductor layer and a gate of the transistors; a plurality of light-emitting devices connected to the transistors; and a connection line on the folding portion. The inorganic insulating layers are not located on at least a part of the folding portion.

20 Claims, 17 Drawing Sheets

(56)                  References Cited

U.S. PATENT DOCUMENTS

| | | | |
|---|---|---|---|
| 2014/0329048 A1 | 11/2014 | Jung et al. | |
| 2016/0211313 A1* | 7/2016 | Kim ..................... | H10K 59/124 |
| 2020/0144563 A1 | 5/2020 | Lee et al. | |

FOREIGN PATENT DOCUMENTS

| | | |
|---|---|---|
| KR | 10-1400284 B1 | 5/2014 |
| KR | 10-2014-0077582 A | 6/2014 |
| KR | 10-2014-0077584 A | 6/2014 |
| KR | 10-2015-0014562 A | 2/2015 |
| KR | 10-2017-0039537 A | 4/2017 |
| KR | 10-2019-0092233 A | 8/2019 |
| KR | 10-2021-0022330 A | 3/2021 |
| KR | 10-2022-0023926 A | 3/2022 |

OTHER PUBLICATIONS

Garner, S., et al., "Flexible glass substrates for roll-to-roll manu-facturing," CORNING, Science and Technology, Oct. 2011, 18 pages.

* cited by examiner

DISPLAY DEVICE

CROSS-REFERENCE TO RELATED APPLICATIONS

This application claims priority to and the benefit of Korean Patent Application No. 10-2022-0065970, filed on May 30, 2022, in the Korean Intellectual Property Office, the entire content of which is incorporated by reference herein.

BACKGROUND

1. Field

Aspects of embodiments of the present disclosure relate to a display device.

2. Description of the Related Art

In general, a display device includes a display module to display an image, and a supporting part to support the display module. The display module includes a display panel to display an image, a window disposed on the display panel to protect the display panel from an external scratch and/or impact, and a protection layer disposed below the display panel to protect the display panel from an external impact. The supporting part may have higher hardness than that of the display module, and may support the display module.

A flexible display device includes a flexible display module, which may be bent or rolled. A foldable display module, which is an example of the flexible display module, may be folded and/or unfolded along a folding axis. A display module includes a substrate, a transistor disposed on the substrate, and a light-emitting device disposed on the transistor. Inorganic insulating layers are disposed on the substrate to cover the transistors.

The above information disclosed in this Background section is for enhancement of understanding of the background of the present disclosure, and therefore, it may contain information that does not constitute prior art.

SUMMARY

When a display device is folded, stress may be concentrated to inorganic insulating layers to cause a crack in an inorganic layer, which may be vulnerable to a mechanical stress, and thus, a folding portion of a display module may be damaged. Accordingly, a display device capable of preventing or substantially preventing damage to the folding portion may be desired.

One or more embodiments of the present disclosure are directed to a display device that may prevent or substantially prevent a folding portion from being damaged.

According to one or more embodiments of the present disclosure, a display device includes: a substrate including a first portion, a second portion, and a folding portion between the first and second portions; a plurality of transistors on the substrate, and located on at least the first and second portions; a plurality of inorganic insulating layers extending on the first and second portions to cover a semiconductor layer and a gate of the transistors; a plurality of light-emitting devices connected to the transistors; and a connection line on the folding portion. The inorganic insulating layers are not located on at least a part of the folding portion.

In an embodiment, the folding portion may be configured to be folded and unfolded.

In an embodiment, the folding portion may include: a first folding portion adjacent to the first portion; a second folding portion adjacent to the second portion; and a connecting portion between the first and second folding portions. A transistor from among the plurality of transistors and a light-emitting device from among the plurality of light-emitting devices may be located on the first and second folding portions, and the connection line may be located on the connecting portion.

In an embodiment, the inorganic insulating layers may be located on the first and second folding portions, and may not be located on the connecting portion.

In an embodiment, the plurality of transistors and the plurality of light-emitting devices may not be located on the connecting portion.

In an embodiment, the connecting portion may have the greatest curvature when the folding portion is folded.

In an embodiment, the display device may further include: a first data line connected to the transistors from among the plurality of transistors that are located on the first portion and the first folding portion; and a second data line connected to the transistors from among the plurality of transistors that are located on the second portion and the second folding portion. The first and second data lines may be electrically connected to each other through the connection line.

In an embodiment, the display device may further include: a first organic insulating layer on the transistors located on each of the first and second portions and the first and second folding portions; a connection electrode on the first organic insulating layer; and a second organic insulating layer on the connection electrode. The connection electrode may be connected to a transistor from among the plurality of transistors and a light-emitting device from among the plurality of light-emitting devices.

In an embodiment, the first and second organic insulating layers may be located on the connecting portion, and the first organic insulating layer may be in direct contact with a top surface of the substrate at the connecting portion.

In an embodiment, the first and second data lines and the connection line may be located on the first organic insulating layer to form a single line, and the second organic insulating layer may be on the connection line.

In an embodiment, each of the light-emitting devices may include: a first electrode on and connected to a corresponding transistor from among the plurality of transistors; a second electrode on the first electrode; and an emission layer between the first electrode and the second electrode. The connection line and the first electrode may be located at the same layer as each other on the second organic insulating layer.

In an embodiment, the connection line may be located on a portion of the first folding portion adjacent to the connecting portion, and on a portion of the second folding portion adjacent to the connecting portion, and the connection line may be connected to first and second data lines.

In an embodiment, the display device may further include: an input-sensing part on the light-emitting device, the input-sensing part including: a first conductive pattern; and a second conductive pattern on the first conductive pattern; a first data line on a portion of the first folding portion; a second data line on a portion of the second folding portion; and pad electrodes on and connected to the first and second data lines on the first and second folding portions, the pad electrodes being located at the same layer as that of the second conductive pattern. The connection line may be located on and connected to the pad electrodes.

In an embodiment, the display device may further include: a third organic insulating layer on the second conductive pattern; and a fourth organic insulating layer on the third organic insulating layer. The connection line may be located on the third organic insulating layer, and the fourth organic insulating layer may be located on the connection line.

In an embodiment, the third organic insulating layer may be in direct contact with a top surface of the substrate at the connecting portion.

In an embodiment, the display device may further include a flexible film including the connection line. The flexible film may be located on the pad electrodes, and the connection line may be connected to the pad electrodes.

In an embodiment, the substrate may be cut at the connecting portion.

In an embodiment, a light emitting device from among the light-emitting devices may be located on the connecting portion, and the light-emitting device located on the connecting portion may be connected to a transistor from among the transistors located on one of the first or second folding portions.

In an embodiment, the display device may further include: a dummy substrate on the connecting portion; and a dummy light-emitting device on the dummy substrate. The substrate may be cut at the connecting portion, and the dummy light-emitting device may be connected to a transistor from among the transistors located on one of the first or second folding portions by the connection line.

In an embodiment, the substrate may be perpendicularly bent at the connecting portion.

BRIEF DESCRIPTION OF THE DRAWINGS

The above and other aspects and features of the present disclosure will be more clearly understood from the following detailed description of the illustrative, non-limiting embodiments with reference to the accompanying drawings.

FIG. 12 is a sectional view illustrating a display panel according to an embodiment of the present disclosure.

FIG. 13 is a sectional view illustrating a display panel according to an embodiment of the present disclosure.

FIG. 15 is an enlarged view illustrating a substrate according to an embodiment of the present disclosure.

DETAILED DESCRIPTION

Figure 1:
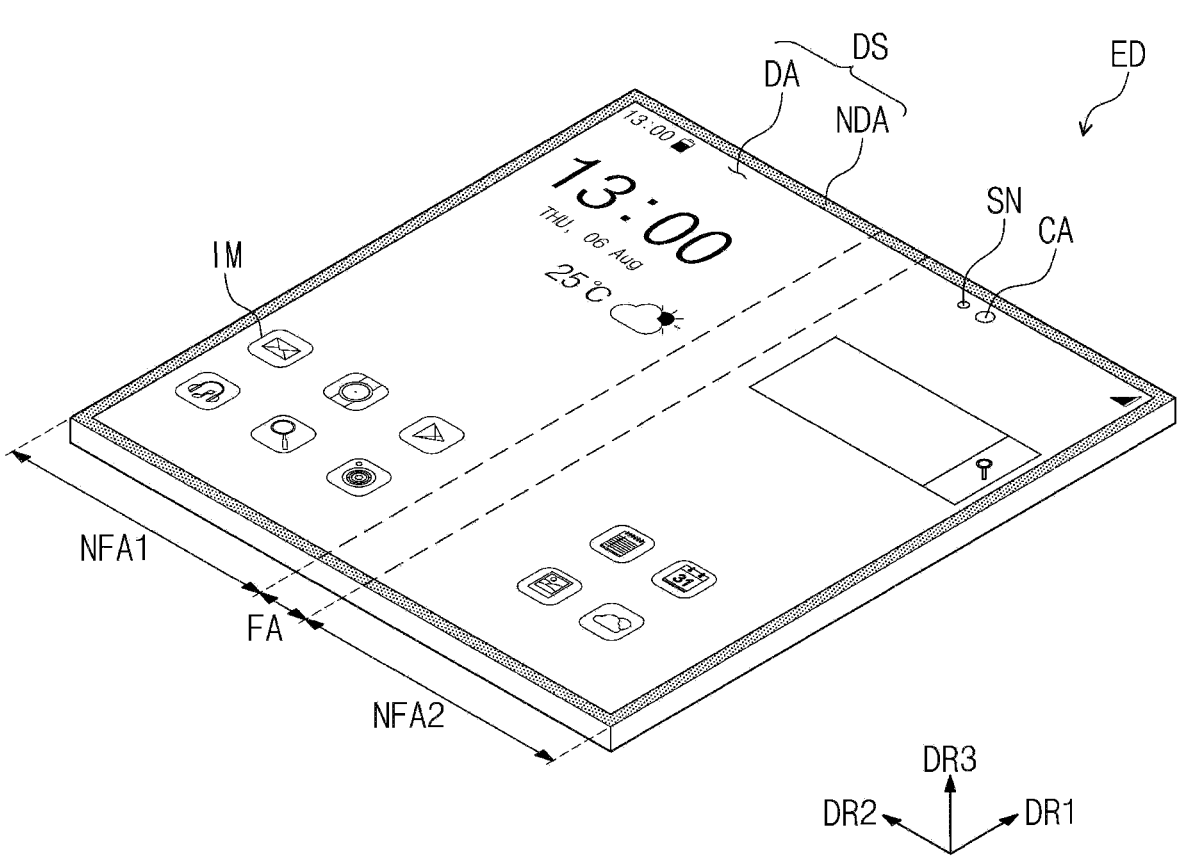
FIG. 1 is a perspective view illustrating a display device according to an embodiment of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

Example embodiments of the present disclosures are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the present disclosures should not be construed as limited to the particular shapes of regions illustrated herein, but are to include deviations in shapes that result, for example, from manufacturing.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present. Other terms used to describe relationships between elements or layers should be interpreted in a like fashion (e.g., "adjacent" versus "directly adjacent").

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view illustrating a display device according to an embodiment of the present disclosure.

Referring to FIG. 1, a display device ED according to an embodiment of the present disclosure may have a rectangular shape having long sides that are parallel to or substantially parallel to a first direction DR1, and short sides that are parallel to or substantially parallel to a second direction DR2 crossing the first direction DR1. However, the present disclosure is not limited thereto, and in an embodiment, the display device ED may have various suitable shapes, such as a circular shape, or another suitable polygonal shape. The display device ED may be a flexible display device.

Hereinafter, a direction that is perpendicular to or substantially perpendicular to both of the first and second directions DR1 and DR2 will be referred to as a third direction DR3. Furthermore, the expressions "when viewed in a plan view" or "in a plan view" as used in the present specification describe a structure that is viewed in or from the third direction DR3.

The display device ED may include a folding region FA, and a plurality of non-folding regions NFA1 and NFA2. The non-folding regions NFA1 and NFA2 may include a first non-folding region NFA1 and a second non-folding region NFA2. The folding region FA may be disposed between the first and second non-folding regions NFA1 and NFA2. The folding region FA, the first non-folding region NFA1, and the second non-folding region NFA2 may be arranged along the second direction DR2.

Although one folding region FA and two non-folding regions NFA1 and NFA2 are illustrated for convenience, the numbers of the folding region FA and the non-folding regions NFA1 and NFA2 are not limited thereto. For example, the display device ED may include two or more non-folding regions, and a plurality of folding regions disposed between the non-folding regions.

A top surface of the display device ED may be referred to as a display surface DS, and the display surface DS may have a flat or substantially flat surface defined by the first and second directions DR1 and DR2. Images IM generated by the display device ED may be provided to a user through the display surface DS.

The display surface DS may include a display region DA, and a non-display region NDA around (e.g., adjacent to) the display region DA. The display region DA may be used to display an image, and the non-display region NDA may not display an image. The non-display region NDA may be disposed to enclose (e.g., to surround around a periphery of) the display region DA, and may define an edge of the display device ED, which is printed with a desired color (e.g., a predetermined or specific color).

The display device ED may include at least one sensor SN, and at least one camera CA. The sensor SN and the camera CA may be adjacent to an edge portion of the display device ED. The sensor SN and the camera CA may be disposed at (e.g., in or on) the display region DA adjacent to the non-display region NDA. The sensor SN and the camera CA may be disposed at (e.g., in or on) the second non-folding region NFA2, but the present disclosure is not limited thereto. For example, the sensor SN and the camera CA may be disposed at (e.g., in or on) the first non-folding region NFA1.

Light may pass through portions of the display device ED, in which the sensor SN and the camera CA are disposed, and may be provided to the camera CA and the sensor SN. In an embodiment, the sensor SN may be an optical proximity sensor, but the kind of the sensor SN is not limited thereto. The camera CA may be configured to obtain an image of an external object. The sensor SN and the camera CA may be provided in a plurality.

Figure 2:
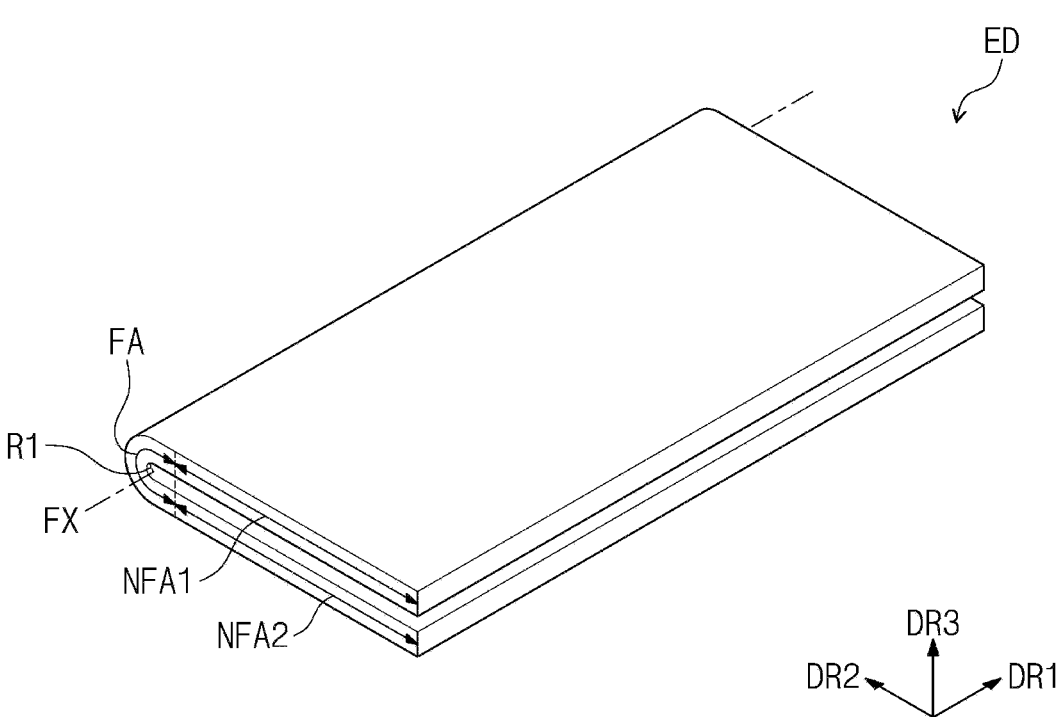
FIG. 2 is a perspective view illustrating the display device of FIG. 1 in a folding state.

FIG. 2 is a perspective view illustrating the display device of FIG. 1 in a folding state.

Referring to FIG. 2, the display device ED may be a foldable display device, which may be folded and/or unfolded. For example, when the display device ED is folded, the folding region FA may be bent along a folding axis FX that is parallel to or substantially parallel to the first direction DR1. In other words, the folding axis FX may be defined as a long axis that is parallel to or substantially parallel to the long side of the display device ED.

When the display device ED is folded, the display device ED may be folded in an in-folding manner, such that the first and second non-folding regions NFA1 and NFA2 face each other, and the display surface DS is not exposed to the outside. However, the present disclosure is not limited thereto. For example, the display device ED may be folded along the folding axis FX in an out-folding manner, such that the display surface DS is exposed to the outside.

As shown in FIG. 2, a distance between the first and second non-folding regions NFA1 and NFA2 may be equal to or substantially equal to a curvature radius R1.

Figure 3:
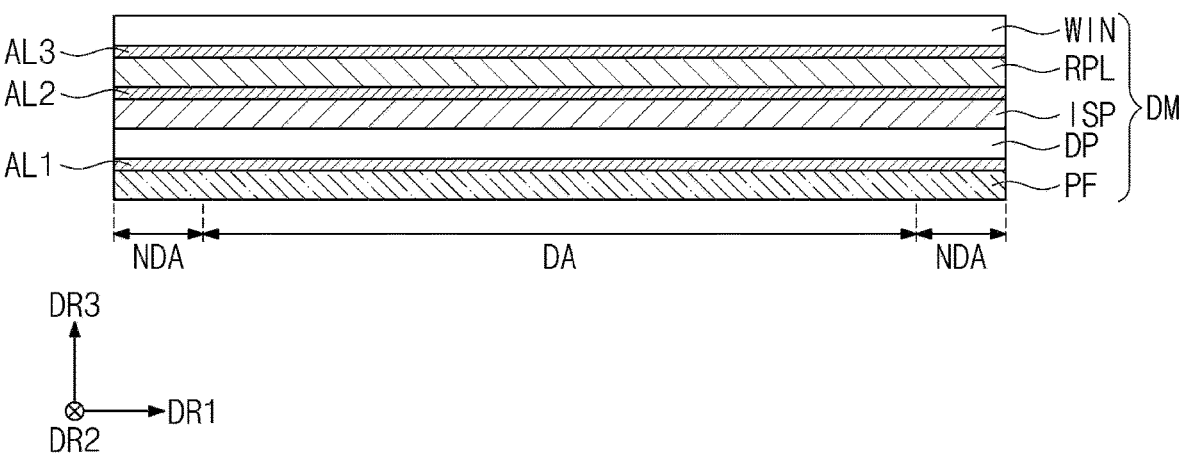
FIG. 3 is a sectional view illustrating a display module.

FIG. 3 is a sectional view illustrating a display module of FIG. 1.

A section (e.g., a cross-section) of the display device ED in the second direction DR2 is illustrated as an example in FIG. 3.

A display module (e.g., a display or a touch-display) DM may include a display panel DP, an input-sensing part (e.g., an input sensor, an input sensing layer, or an input sensing panel) ISP, an anti-reflection layer RPL, a window WIN, a panel protection film PF, and first to third adhesive layers AL1-AL3.

The display panel DP may be a flexible display panel. In an embodiment, the display panel DP may be a light-emitting type display panel, but the present disclosure is not limited to a specific kind of the display panel DP. For example, the display panel DP may be an organic light emitting display panel or an inorganic light-emitting display panel. An emission layer of the organic light emitting display panel may include an organic light emitting material. An emission layer of the inorganic light-emitting display panel may include quantum dots or quantum rods.

The input-sensing part ISP may be disposed on the display panel DP. The input-sensing part ISP may include a plurality of sensor units (e.g., sensors or sensor electrodes), which are configured to sense an external input in an electrostatic capacitance manner. When the display device ED is fabricated, the input-sensing part ISP may be directly formed on the display panel DP. However, the present disclosure is not limited thereto, and in an embodiment, the input-sensing part ISP may be fabricated as a panel that is distinct from the display panel DP, and may then be attached to the display panel DP by an adhesive layer.

The anti-reflection layer RPL may be disposed on the input-sensing part ISP. The anti-reflection layer RPL may be defined as an anti-reflection film to external light. The anti-reflection layer RPL may be configured to reduce reflectance of the external light, which is incident into the display panel DP from the outside of the display device ED.

In a case when the display panel DP, like a mirror, reflects external light toward a user, the user may recognize the external light. In order to prevent or reduce such reflectance of the external light, the anti-reflection layer RPL may include a plurality of color filters for displaying the same or substantially the same colors as those of the pixels of the display panel DP.

The color filters may be configured to filter the external light having the same or substantially the same colors as those of the pixels. In this case, the external light may not be recognized by a user. However, the present disclosure is not limited thereto, and in an embodiment, the anti-reflection layer RPL may include a polarization film, which may include a phase retarder and/or a polarizer, and is configured to lower the reflectance of external light.

The window WIN may be disposed on the anti-reflection layer RPL. The window WIN may protect the display panel DP, the input-sensing part ISP, and the anti-reflection layer RPL from an external scratch and/or impact.

The panel protection film PF may be disposed below (e.g., underneath) the display panel DP. The panel protection film PF may protect a bottom portion of the display panel DP. The panel protection film PF may be formed of or may include a flexible plastic material (e.g., such as polyethylene terephthalate (PET)).

The first adhesive layer AL1 may be disposed between the display panel DP and the panel protection film PF. The display panel DP and the panel protection film PF may be bonded to each other by the first adhesive layer AL1. However, the present disclosure is not limited thereto, and in an embodiment, the panel protection film PF may be directly formed below (e.g., underneath) the display panel DP.

The second adhesive layer AL2 may be disposed between the anti-reflection layer RPL and the input-sensing part ISP. The anti-reflection layer RPL and the input-sensing part ISP may be bonded to each other by the second adhesive layer AL2. However, the present disclosure is not limited thereto, and in an embodiment, the anti-reflection layer RPL may be directly formed on the input-sensing part ISP.

The third adhesive layer AL3 may be disposed between the window WIN and the anti-reflection layer RPL. The window WIN and the anti-reflection layer RPL may be bonded to each other by the third adhesive layer AL3. However, the present disclosure is not limited thereto, and in an embodiment, the window WIN may be directly formed on the anti-reflection layer RPL.

Figure 4:
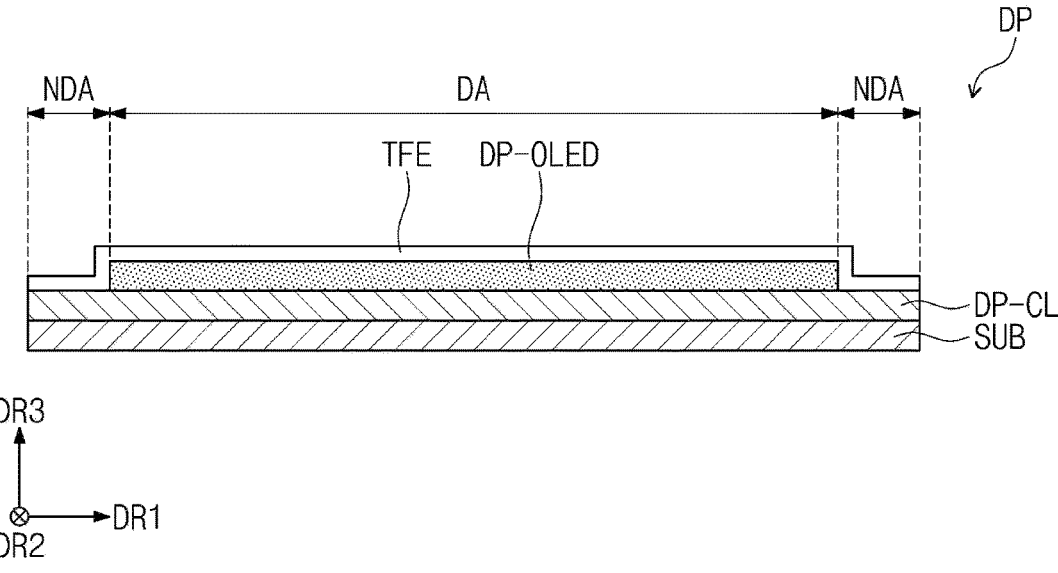
FIG. 4 is a sectional view illustrating a display panel of FIG. 3.

FIG. 4 is a sectional view illustrating a display panel of FIG. 3.

A section (e.g., a cross-section) of the display panel DP in the second direction DR2 is illustrated as an example in FIG. 4.

Referring to FIG. 4, the display panel DP may include a substrate SUB, a circuit device layer DP-CL disposed on the substrate SUB, a display device layer DP-OLED disposed on the circuit device layer DP-CL, and a thin encapsulation layer TFE disposed on the display device layer DP-OLED.

The substrate SUB may include the display region DA, and the non-display region NDA around (e.g., adjacent to) the display region DA. The substrate SUB may be formed of or may include a flexible plastic material (e.g., such as poly imide (PI)). The display device layer DP-OLED may be disposed at (e.g., in or on) the display region DA.

A plurality of pixels may be disposed at (e.g., in or on) the display region DA. Each of the pixels may include a light-emitting device, which is disposed in the display device layer DP-OLED, and is connected to a transistor in the circuit device layer DP-CL.

The thin encapsulation layer TFE may be disposed on the circuit device layer DP-CL to cover the display device layer DP-OLED. The thin encapsulation layer TFE may include inorganic layers, and an organic layer between the inorganic layers. The inorganic layers may protect the pixels from moisture and/or oxygen. The organic layer may protect pixels PX from a contamination material, such as dust particles.

Figure 5:
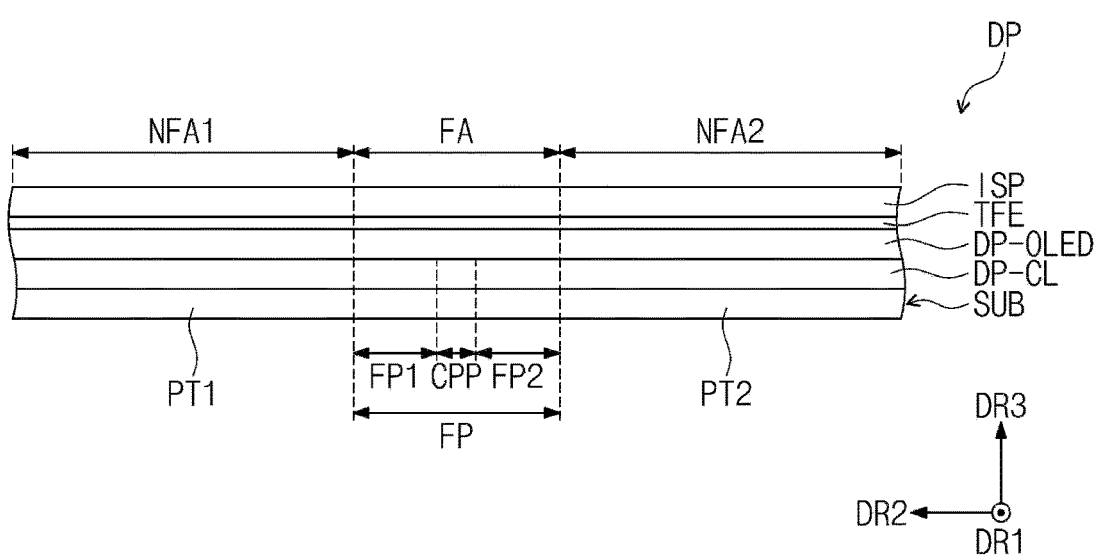
FIG. 5 is a sectional view illustrating a portion of a display panel corresponding to a folding region, and non-folding regions adjacent to the folding region shown in FIG. 1.

FIG. 5 is a sectional view illustrating a portion of a display panel corresponding to a folding region, and non-folding regions adjacent to the folding region shown in FIG. 1.

In the embodiment illustrated in FIG. 5, the substrate SUB, the circuit device layer DP-CL, the display device layer DP-OLED, the thin encapsulation layer TFE, and the input-sensing part ISP may be the same or substantially the same as those described above with reference to FIGS. 3 and 4, and thus, redundant description thereof may not be repeated.

When viewed in the first direction DR1, the display panel DP may include the folding region FA, and the first and second non-folding regions NFA1 and NFA2, similarly to the display device ED of FIG. 1. The folding region FA may be disposed between the first and second non-folding regions NFA1 and NFA2. The folding region FA, the first non-folding region NFA1, and the second non-folding region NFA2 may be arranged along the second direction DR2.

The substrate SUB may include a first portion PT1, a second portion PT2, and a folding portion FP. When viewed in a plan view, the first portion PT1 of the substrate SUB may overlap with the first non-folding region NFA1 of the display panel DP. When viewed in a plan view, the second portion PT2 of the substrate SUB may overlap with the second non-folding region NFA2 of the display panel DP. When viewed in a plan view, the folding portion FP of the substrate SUB may overlap with the folding region FA of the display panel DP. The folding portion FP may be folded and unfolded, similar to the folding region FA.

The folding portion FP may include a connecting portion CPP, a first folding portion FP1, and a second folding portion FP2. The connecting portion CPP may be disposed between the first and second folding portions FP1 and FP2. The connecting portion CPP, the first folding portion FP1, and the second folding portion FP2 may be arranged along the second direction DR2.

The first folding portion FP1 may be adjacent to the first portion PT1. The second folding portion FP2 may be adjacent to the second portion PT2. The connecting portion CPP may be disposed between the first and second folding portions FP1 and FP2. The first folding portion FP1 may be disposed between the connecting portion CPP and the first portion PT1. The second folding portion FP2 may be disposed between the connecting portion CPP and the second portion PT2.

A stacking structure of the folding region FA will be described in more detail below with reference to FIG. 10.

Figure 6:
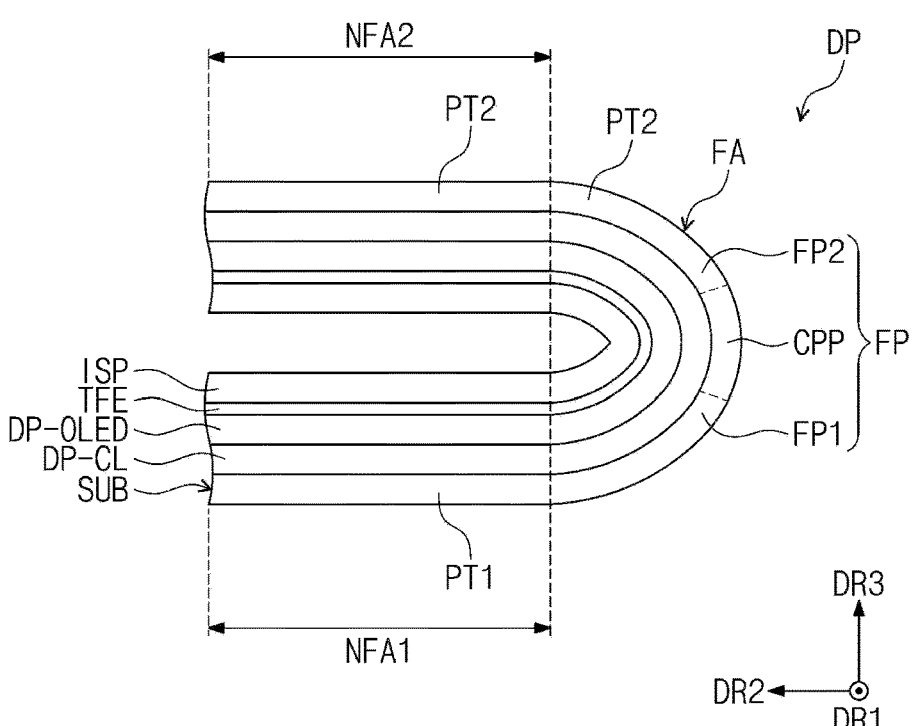
FIG. 6 is a sectional view illustrating the display panel of FIG. 5 in a folding state.

FIG. 6 is a sectional view illustrating the display panel DP of FIG. 5 in a folding state.

Referring to FIG. 6, when the folding region FA is folded to fold the display panel DP, the second non-folding region NFA2 may face the first non-folding region NFA1. When the display panel DP is folded, the folding portion FP may be folded. When the folding portion FP is folded, the first portion PT1 may be disposed to face the second portion PT2. Thus, the first portion PT1 may overlap with the second portion PT2, when viewed in the third direction DR3. In addition, the second folding portion FP2 may face the first folding portion FP1, and may overlap with the first folding portion FP1.

When the display panel DP is folded, the folding portion FP may be bent to have a suitable curvature (e.g., a prede- termined or specific curvature). For example, the first and second folding portions FP1 and FP2 may be bent to have a suitable curvature (e.g., a predetermined or specific curva- ture), and the connecting portion CPP may be bent to have a suitable curvature (e.g., a predetermined or specific cur- vature). The curvature of the connecting portion CPP may be greater than the curvatures of the first and second folding portions FP1 and FP2. When the folding portion FP is folded, the connecting portion CPP may be bent more sharply. In other words, when the folding portion FP is folded, the connecting portion CPP may have the largest curvature.

Figure 7:
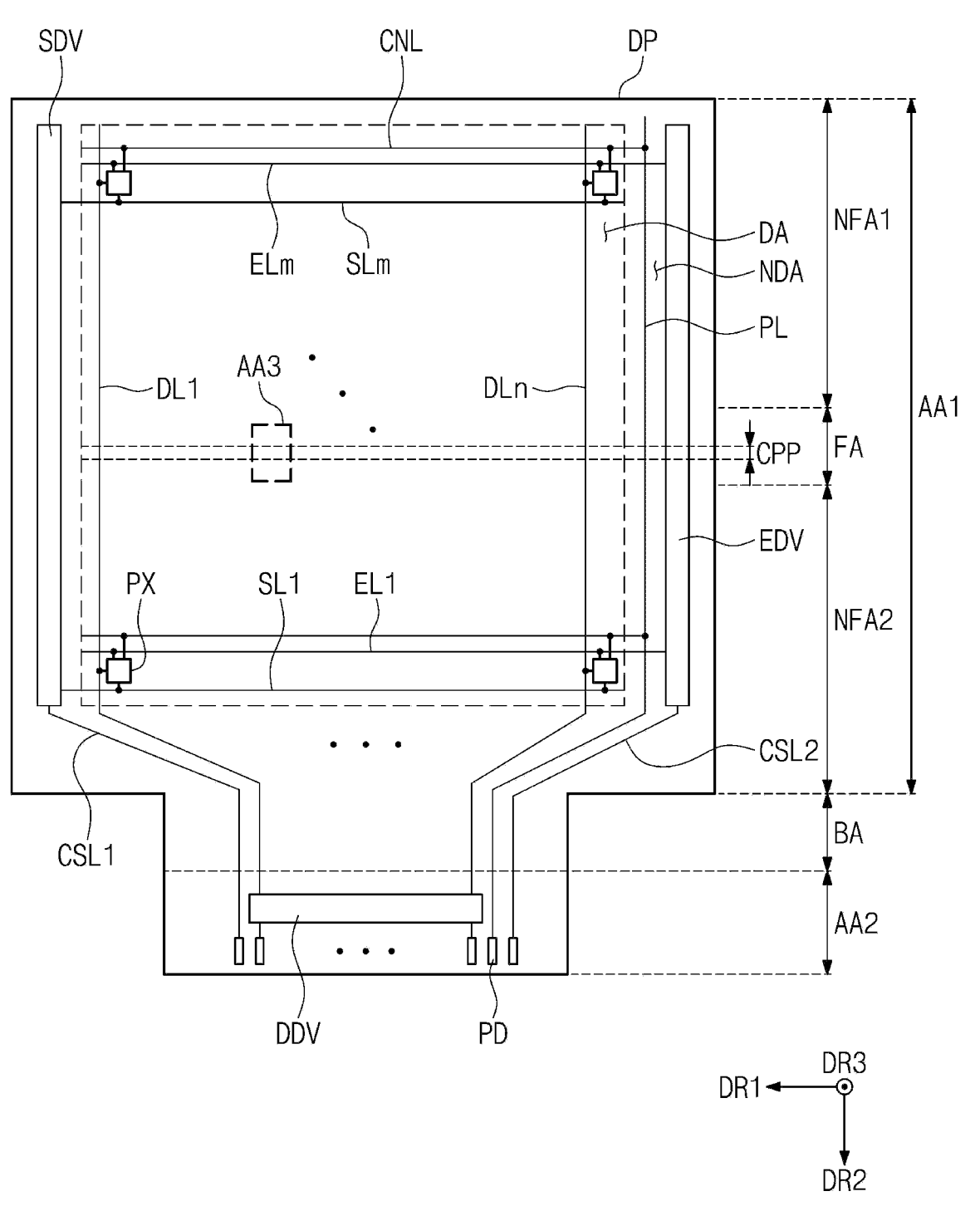
FIG. 7 is a plan view illustrating the display panel of FIG. 3.

FIG. 7 is a plan view illustrating the display panel of FIG. 3.

Referring to FIG. 7, the display device ED may include the display panel DP, a scan driver SDV, a data driver DDV, and an emission driver EDV.

The display panel DP may include a first region AA1, a second region AA2, and a bending region BA between the first and second regions AA1 and AA2. The bending region BA may be extended in the first direction DR1, and the first region AA1, the bending region BA, and the second region AA2 may be arranged along the second direction DR2.

The first region AA1 may include the display region DA, and the non-display region NDA near (e.g., adjacent to) the display region DA. The non-display region NDA may be provided to enclose (e.g., to surround around a periphery of) the display region DA. The display region DA may be a region used to display an image, and the non-display region NDA may be a region that does not display an image. The second region AA2 and the bending region BA may not display an image.

The first region AA1 may include the first non-folding region NFA1, the second non-folding region NFA2, and the folding region FA between the first and second non-folding regions NFA1 and NFA2, when viewed in the third direction DR3. A portion of the substrate SUB overlapping with the folding region FA may include the first folding portion FP1, the connecting portion CPP, and the second folding portion FP2.

The display panel DP may include a plurality of pixels PX, a plurality of scan lines SL1-SLm, a plurality of data lines DL1-DLn, a plurality of emission lines EL1-ELm, first and second control lines CSL1 and CSL2, a power line PL, connection lines CNL, and a plurality of pads PD. Here, m and n may be natural numbers. The pixels PX may be disposed at (e.g., in or on) the display region DA, and may be connected to the scan lines SL1-SLm, the data lines DL1-DLn, and the emission lines EL1-ELm. The pixels PX may not be disposed at (e.g., in or on) a portion of the display panel DP overlapping with the folding portion FP of the substrate SUB, which will be described in more detail below.

The scan driver SDV and the emission driver EDV may be disposed at (e.g., in or on) the non-display region NDA. The scan driver SDV and the emission driver EDV may be disposed at (e.g., in or on) two regions, respectively, of the non-display region NDA. The two regions may be opposite to each other in the first direction DR1, and may be located at opposite sides of the first region AA1 relative to the display region DA. The data driver DDV may be disposed at (e.g., in or on) the second region AA2. The data driver DDV may be fabricated in the form of an integrated circuit chip, and may be mounted on the second region AA2.

The scan lines SL1-SLm may be extended in the first direction DR1, and may be connected to the scan driver SDV. The data lines DL1-DLn may be extended in the second direction DR2, and may be connected to the data driver DDV via the bending region BA. The data lines DL1-DLn may be connected to each other through a connection line CPD (e.g., see FIG. 9) at (e.g., in or on) a region of the display panel DP overlapping with the connecting portion CPP of the substrate SUB. The emission lines EL1-Elm may be extended in the first direction DR1, and may be connected to the emission driver EDV.

The power line PL may be extended in the second direction DR2, and may be disposed at (e.g., in or on) the non-display region NDA. The power line PL may be disposed between the display region DA and the emission driver EDV, but the present disclosure is not limited thereto. For example, the power line PL may be disposed between the display region DA and the scan driver SDV.

The power line PL may be extended into the second region AA2 through the bending region BA. The power line PL may be extended toward a lower end of the second region AA2, when viewed in a plan view. The power line PL may receive a driving voltage.

The connection lines CNL may be extended in the first direction DR1, and may be arranged along the second direction DR2. The connection lines CNL may be connected to the power line PL and the pixels PX. The driving voltage may be applied to the pixels PX through the power line PL and the connection lines CNL, which are connected to each other.

The first control line CSL1 may be connected to the scan driver SDV, and may be extended toward the lower end of the second region AA2 via the bending region BA. The second control line CSL2 may be connected to the emission driver EDV, and may be extended toward the lower end of the second region AA2 via the bending region BA. The data driver DDV may be disposed between the first control line CSL1 and the second control line CSL2.

When viewed in a plan view, the pads PD may be disposed adjacent to the lower portion of the second region AA2. The data driver DDV, the power line PL, the first control line CSL1, and the second control line CSL2 may be connected to the pads PD.

The data lines DL1-DLn may be connected to corresponding ones of the pads PD through the data driver DDV. For example, the data lines DL1-DLn may be connected to the data driver DDV, and the data driver DDV may be connected to the pads PD corresponding to the data lines DL1-DLn, respectively.

A printed circuit board may be connected to the pads PD, and a timing controller and a voltage generator may be disposed on the printed circuit board. The timing controller may be fabricated in the form of an integrated circuit chip, and may be mounted on the printed circuit board. The timing controller and the voltage generator may be connected to the pads PD through the printed circuit board.

The timing controller may control operations of the scan driver SDV, the data driver DDV, and the emission driver EDV. The timing controller may generate a scan control signal, a data control signal, and an emission control signal, in response to control signals transmitted from the outside. The voltage generator may be configured to generate the driving voltage.

The scan control signal may be provided to the scan driver SDV through the first control line CSL1. The emission control signal may be provided to the emission driver EDV through the second control line CSL2. The data control signal may be provided to the data driver DDV. The timing controller may receive image signals from the outside, may convert the image signals to data in a data format, which is suitable for interface specifications used by the data driver DDV, and may provide the converted data to the data driver DDV.

The scan driver SDV may generate a plurality of scan signals in response to the scan control signal. The scan signals may be applied to the pixels PX through the scan lines SL1-SLm. The scan signals may be sequentially applied to the pixels PX.

The data driver DDV may generate a plurality of data voltages, which correspond to the image signals, in response to the data control signal. The data voltages may be applied to the pixels PX through the data lines DL1-DLn. The emission driver EDV may generate a plurality of emission signals in response to the emission control signal. The emission signals may be applied to the pixels PX through the emission lines EL1-ELm.

The pixels PX may receive the data voltages in response to the scan signals. The pixels PX may be configured to emit light, which has a desired brightness level corresponding to the data voltage, in response to the emission signals, and thereby, may display an image. A light-emitting time of the pixels PX may be controlled by the emission signals.

Figure 8:
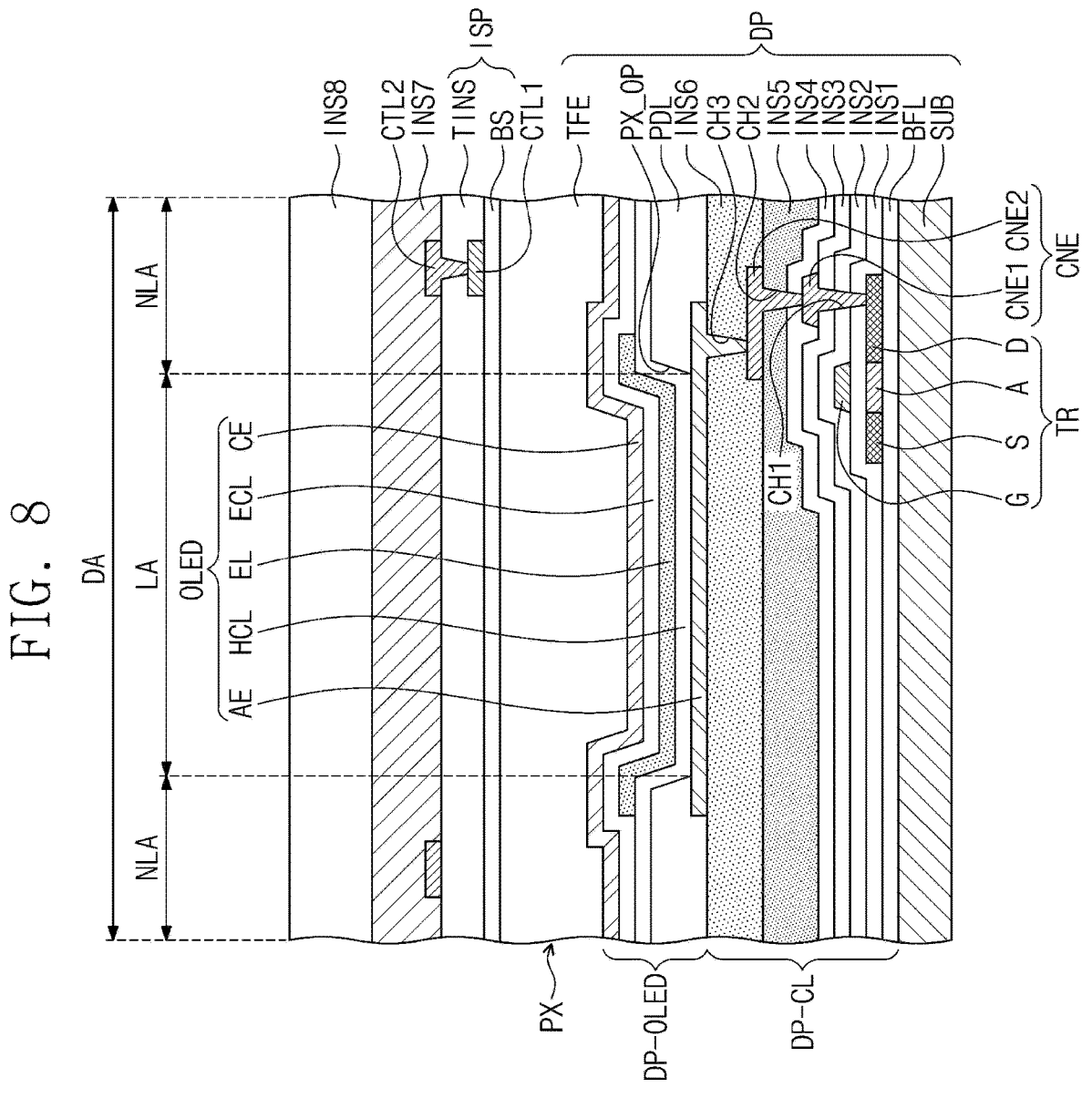
FIG. 8 is a sectional view illustrating a portion of a display panel corresponding to one of the pixels of a first portion of FIG. 7.

FIG. 8 is a sectional view illustrating a portion of a display panel corresponding to one of the pixels of a first portion of FIG. 7.

Referring to FIG. 8, the pixel PX may include a transistor TR and a light-emitting device OLED. The light-emitting device OLED may include a first electrode or anode AE, a second electrode or cathode CE, a hole control layer HCL, an electron control layer ECL, and an emission layer EL.

The transistor TR and the light-emitting device OLED may be disposed on the substrate SUB. One transistor TR is illustrated as an example, but the present disclosure is not limited thereto, and in an embodiment, the pixel PX may include a plurality of transistors, which are used to drive the light-emitting device OLED, and at least one capacitor.

The display region DA may include a light-emitting region LA, which corresponds to each of the pixels PX, and a non-light-emitting region NLA, which is provided around (e.g., adjacent to) the light-emitting region LA. The light-emitting device OLED may be disposed at (e.g., in or on) the light-emitting region LA.

A buffer layer BFL may be disposed on the substrate SUB, and in an embodiment, the buffer layer BFL may be an inorganic layer. A semiconductor pattern may be disposed on the buffer layer BFL. The semiconductor pattern may be formed of or may include at least one of poly silicon, amorphous silicon, or one or more suitable metal oxide materials.

The semiconductor pattern may be doped with an n-type dopant or a p-type dopant. The semiconductor pattern may include a highly-doped region and a lightly-doped region. The highly-doped region may have higher conductivity than that of the lightly-doped region, and may be used or substantially used as a source or drain electrode of the transistor TR. The lightly-doped region may be used or substantially used as an active (or channel) region of a transistor.

A source S, an active A, and a drain D of the transistor TR may be formed from the semiconductor pattern. A first insulating layer INS1 may be disposed on the semiconductor pattern. A gate G of the transistor TR may be disposed on the first insulating layer INS1. A second insulating layer INS2 may be disposed on the gate G. A third insulating layer INS3 may be disposed on the second insulating layer INS2.

A connection electrode CNE may include a first connection electrode CNE1 and a second connection electrode CNE2, which connect the transistor TR to the light-emitting device OLED. The first connection electrode CNE1 may be disposed on the third insulating layer INS3, and may be connected to the drain D through a first contact hole CH1 defined in (e.g., penetrating) the first to third insulating layers INS1-INS3.

A fourth insulating layer INS4 may be disposed on the first connection electrode CNE1. In an embodiment, the first to fourth insulating layers INS1-INS4 may be inorganic insulating layers. A fifth insulating layer INS5 may be disposed on the fourth insulating layer INS4. The fifth insulating layer INS5 may be an organic insulating layer. Hereinafter, the fifth insulating layer INS5 may be referred to as a first organic insulating layer INS5. The second connection electrode CNE2 may be disposed on the first organic insulating layer INS5. The second connection electrode CNE2 may be connected to the first connection electrode CNE1 through a second contact hole CH2 defined in (e.g., penetrating) the fourth and fifth insulating layers INS4 and INS5.

A sixth insulating layer INS6 may be disposed on the second connection electrode CNE2. The sixth insulating layer INS6 may be an organic insulating layer. Hereinafter, the sixth insulating layer INS6 may be referred to as a second organic insulating layer INS6. A structure including the buffer layer BFL, the second organic insulating layer INS6, and the layers therebetween may be defined as the circuit device layer DP-CL.

The first electrode AE may be disposed on the second organic insulating layer INS6. The first electrode AE may be connected to the second connection electrode CNE2 through a third contact hole CH3 defined in (e.g., penetrating) the sixth insulating layer INS6. A pixel definition layer PDL may be disposed on the first electrode AE and the sixth insulating layer INS6. An opening PX_OP exposing a portion of the first electrode AE may be defined in (e.g., may penetrate) the pixel definition layer PDL.

The hole control layer HCL may be disposed on the first electrode AE and the pixel definition layer PDL. The hole control layer HCL may include a hole transport layer and/or a hole injection layer.

The emission layer EL may be disposed on the hole control layer HCL. The emission layer EL may be disposed in a region corresponding to the opening PX_OP. The emission layer EL may be formed of or may include at least one of various suitable organic and/or inorganic materials. The emission layer EL may be configured to emit one of red, green, or blue lights.

The electron control layer ECL may be disposed on the emission layer EL and the hole control layer HCL. The electron control layer ECL may include an electron transport layer and/or an electron injection layer. The hole control layer HCL and the electron control layer ECL may be disposed in common at (e.g., in or on) the light-emitting region LA and the non-light-emitting region NLA.

The second electrode CE may be disposed on the electron control layer ECL. The second electrode CE may be disposed in common for the pixels PX. For example, the second electrode CE may be a single electrode that is disposed throughout the display region DA. A layer provided with the light-emitting device OLED may be defined as the display device layer DP-OLED.

The thin encapsulation layer TFE may be disposed on the circuit device layer DP-CL to cover the display device layer DP-OLED. The thin encapsulation layer TFE may include inorganic layers, and an organic layer between the inorganic layers. The inorganic layers may protect the pixels PX from moisture and/or oxygen. The organic layer may protect the pixels PX from a contamination material (e.g., such as dust particles).

A first voltage may be applied to the first electrode AE through the transistor TR, and a second voltage lower than the first voltage may be applied to the second electrode CE. Holes and electrons, which are injected into the emission layer EML, may be combined with each other to form excitons, and the light-emitting device OLED may emit light when the holes and/or electrons return to their ground state.

The input-sensing part ISP may be disposed on the thin encapsulation layer TFE. The input-sensing part ISP may be directly fabricated on a top surface of the thin encapsulation layer TFE.

A base layer BS may be disposed on the thin encapsulation layer TFE. The base layer BS may include an inorganic insulating layer. At least one inorganic insulating layer, which is used as the base layer BS, may be provided on the thin encapsulation layer TFE.

The input-sensing part ISP may include a first conductive pattern CTL1, and a second conductive pattern CTL2 disposed on the first conductive pattern CTL1. The first conductive pattern CTL1 may be disposed on the base layer BS. An insulating layer TINS may be disposed on the base layer BS to cover the first conductive pattern CTL1. The insulating layer TINS may include an inorganic insulating layer or an organic insulating layer. The second conductive pattern CTL2 may be disposed on the insulating layer TINS.

The first and second conductive patterns CTL1 and CTL2 may overlap with the non-light-emitting region NLA. The first and second conductive patterns CTL1 and CTL2 may be disposed at (e.g., in or on) the non-light-emitting region NLA between adjacent light-emitting regions LA, and may have a mesh shape.

The first and second conductive patterns CTL1 and CTL2 may form the sensor units (e.g., the sensors or sensor electrodes) of the input-sensing part ISP. For example, the first and second conductive patterns CTL1 and CTL2 having the mesh shape may be spaced apart from each other in a suitable region (e.g., a predetermined or specific region) to form the sensor units. A portion of the second conductive pattern CTL2 may be connected to the first conductive pattern CTL1.

A seventh insulating layer INS7 may be disposed on the second conductive pattern CTL2. The seventh insulating layer INS7 may be disposed on the input-sensing part ISP. The seventh insulating layer INS7 may be an organic insulating layer. Hereinafter, the seventh insulating layer INS7 may be referred to as a third organic insulating layer INS7.

An eighth insulating layer INS8 may be disposed on the third organic insulating layer INS7. The eighth insulating layer INS8 may be an organic insulating layer. Hereinafter, the eighth insulating layer INS8 may be referred to as a fourth organic insulating layer INS8.

Figure 9:
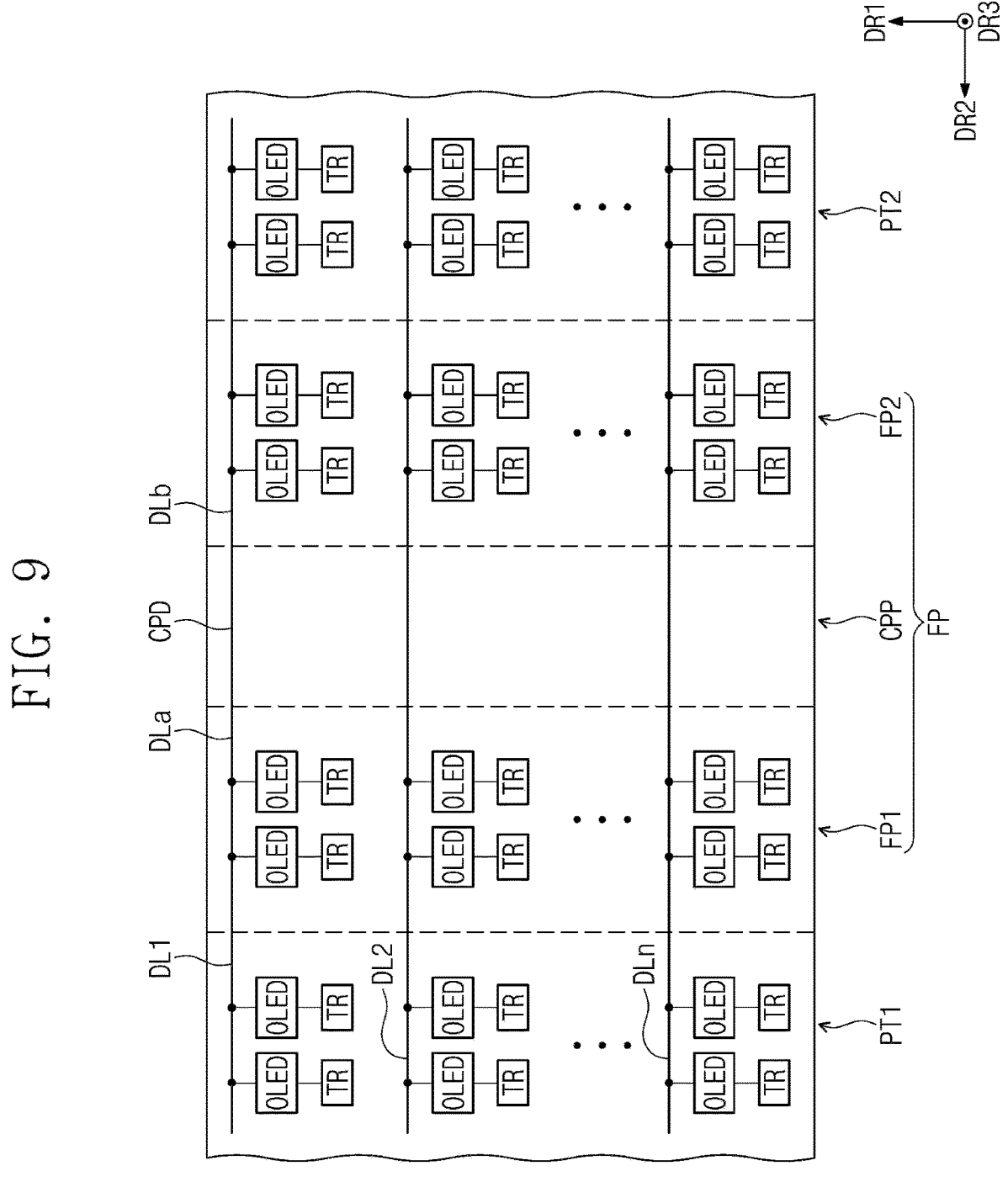
FIG. 9 is an enlarged view illustrating the region AA3 of FIG. 7.

FIG. 9 is an enlarged view illustrating the region AA3 of FIG. 7.

FIG. 9 illustrates an example of arrangement of the pixels PX disposed on the substrate. Hereinafter, an embodiment of the present disclosure will be described in more detail with reference to FIG. 9 in conjunction with FIGS. 5 and 7.

Referring to FIGS. 5 and 9, the substrate SUB may include the first portion PT1, the second portion PT2, and the folding portion FP. As described above with reference to FIG. 5, the first portion PT1 may overlap with the first non-folding region NFA1, the second portion PT2 may overlap with the second non-folding region NFA2, and the folding portion FP may overlap with the folding region FA.

A plurality of light-emitting devices OLED and the data lines DL1-DLn may be disposed at (e.g., in or on) the first and second portions PT1 and PT2. The data lines DL1-DLn may be extended in the second direction DR2 from the first portion PT1 to the second portion PT2, and may be arranged along the first direction DR1. The number of transistors TR disposed at (e.g., in or on) the first and second portions PT1 and PT2 may be equal to or substantially equal to the number of the light-emitting devices OLED. The transistors TR may be connected to the light-emitting devices OLED, respectively.

The light-emitting devices OLED and the data lines DL1-DLn may be disposed at (e.g., in or on) the first and second folding portions FP1 and FP2. The data lines DL1-DLn may be extended in the second direction DR2 from the first folding portion FP1 to the second folding portion FP2, and may be arranged along the first direction DR1. The number of the transistors TR disposed at (e.g., in or on) the first and second folding portions FP1 and FP2 may be equal to or substantially equal to the number of the light-emitting devices OLED. The transistors TR may be connected to the light-emitting devices OLED, respectively. The data lines DL1-DLn may be connected to the light-emitting devices OLED. The data lines DL1-DLn may be connected to the first electrodes AE of the light-emitting devices OLED shown in FIG. 8.

Although the transistors TR and the light-emitting devices OLED are illustrated in the plan view of FIG. 9, the transistors TR may be disposed below (e.g., underneath) the light-emitting devices OLED, and may be connected to the light-emitting devices OLED. Each of the light-emitting devices OLED of FIG. 9 may be the same or substantially the same as the light-emitting device OLED illustrated in FIG. 8. Each of the transistors TR of FIG. 9 may be the same or substantially the same as the transistor TR illustrated in FIG. 8.

The light-emitting devices OLED may not be disposed at (e.g., in or on) the connecting portion CPP. The transistors TR may not be disposed at (e.g., in or on) the connecting portion CPP. The connection lines CPD may be disposed at (e.g., in or on) the connecting portion CPP. The connection lines CPD may be extended in the second direction DR2, and may be arranged along the first direction DR1. The connection lines CPD may connect the data lines DL1-DLn disposed at (e.g., in or on) the first folding portion FP1 to the data lines DL1-DLn disposed at (e.g., in or on) the second folding portion FP2.

The data lines DL1-DLn disposed at (e.g., in or on) the first portion PT1 may be extended to a region of the first folding portion FP1, and the data lines DL1-DLn disposed at (e.g., in or on) the second portion PT2 may be extended to a region of the second folding portion FP2. Because the data lines DL1-DLn at (e.g., in or on) the first folding portion FP1 and the data lines DL1-DLn at (e.g., in or on) the second folding portion FP2 are connected to one another by the connection lines CPD, the data lines DL1-DLn of the first portion PT1 and the data lines DL1-DLn of the second portion PT2 may be connected to one another. Thus, the data lines DL1-DLn may be extended in the second direction DR2 from the first portion PT1 to the second portion PT2, and may be arranged along the first direction DR1.

Each of the data lines DL1-DLn may include a first data line DLa and a second data line DLb. The first data line DLa may be disposed at (e.g., in or on) the first portion PT1 and the first folding portion FP1, and the second data line DLb may be disposed at (e.g., in or on) the second portion PT2 and the second folding portion FP2. The first and second data lines DLa and DLb may be connected to a corresponding one of the connection lines CPD.

Although the data lines DL1-DLn crossing the folding region FA are illustrated to be connected to one another by the connection lines CPD, the present disclosure is not limited thereto. For example, various interconnection lines, which are provided to cross the folding region FA, may be connected to one another by additional connection lines. For example, the connection line CNL connected to the afore-described power line may be extended to cross the folding region FA, and may be connected by the connection lines CPD at (e.g., in or on) the connecting portion CPP.

Figure 10:
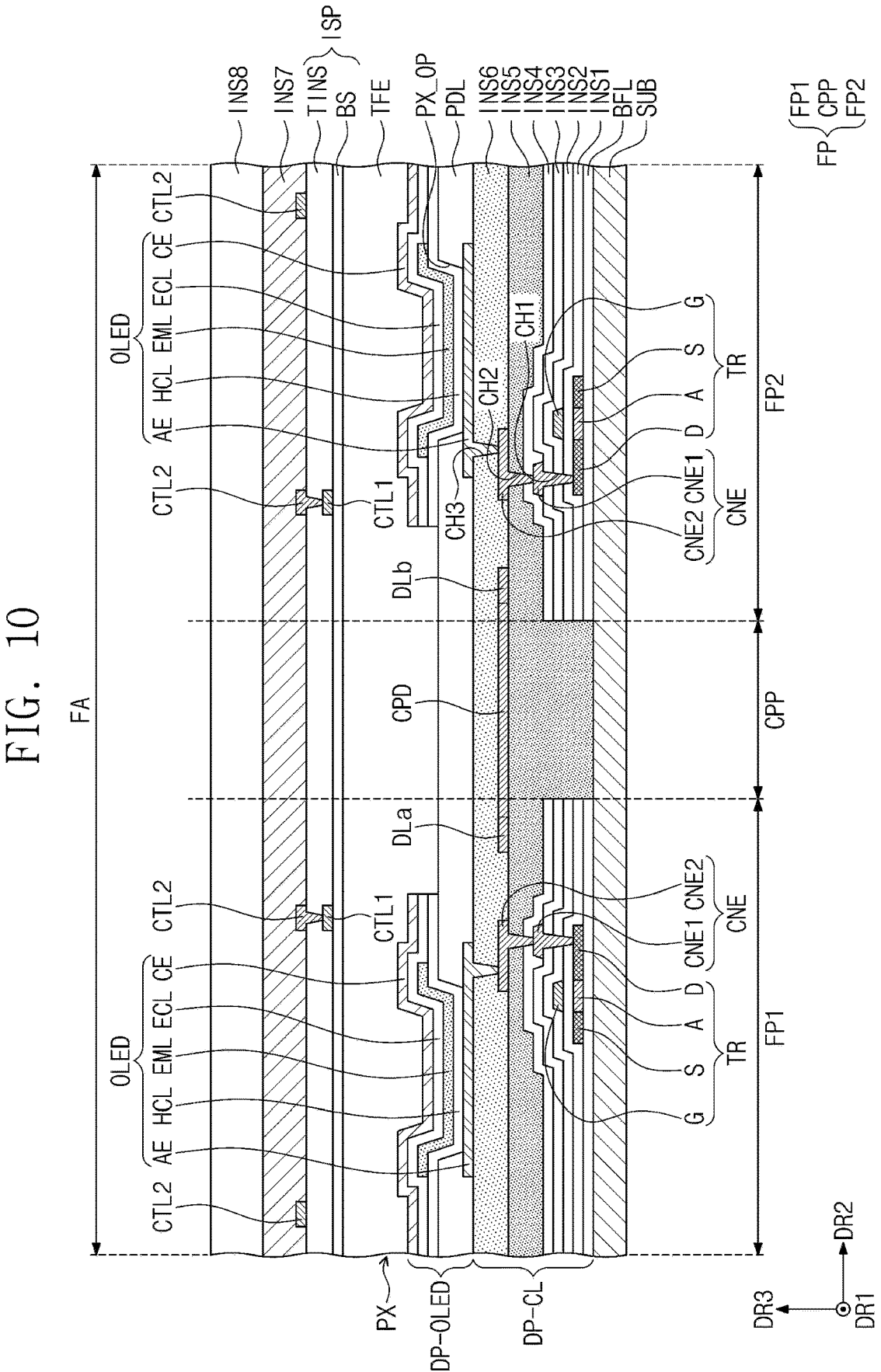
FIG. 10 is a sectional view illustrating pixels of a connecting portion, and first and second folding portions adjacent to the connecting portion shown in FIG. 9.

FIG. 10 is a sectional view illustrating pixels of a connecting portion, and first and second folding portions adjacent to the connecting portion shown in FIG. 9.

A section (e.g., a cross-section) of a structure including the input-sensing part ISP and the display panel DP are illustrated in FIG. 10, which may be similar to those illustrated in FIG. 8.

Referring to FIG. 10, the pixels PX and the input-sensing part ISP at (e.g., in or on) the first and second folding portions FP1 and FP2 may be the same or substantially the same as the pixel PX and the input-sensing part ISP of the embodiment illustrated in FIG. 8. Thus, hereinafter, a structure of the folding portion FP may be mainly described in more detail, and redundant description may be briefly provided or may not be repeated.

The inorganic layers (e.g., including the buffer layer and the first to fourth insulating layers) BFL and INS1-INS4 may be disposed on the substrate SUB. The inorganic layers BFL and INS1-INS4 may be disposed at (e.g., in or on) the first and second folding portions FP1 and FP2. The transistors TR and the light-emitting devices OLED may be disposed at (e.g., in or on) the first and second folding portions FP1 and FP2. The first to fourth insulating layers INS1-INS4 may cover the transistor TR. The first organic insulating layer INS5 may be disposed on the inorganic layers BFL and INS1-INS4. The first organic insulating layer INS5 may be disposed on the transistor TR.

The inorganic layers BFL and INS1-INS4 may not be disposed at (e.g., in or on) a portion of the folding portion FP. For example, the inorganic layers BFL and INS1-INS4 may not be disposed at (e.g., in or on) the connecting portion CPP. The transistors TR and the light-emitting devices OLED may not be disposed at (e.g., in or on) the connecting portion CPP. The light-emitting devices OLED may not be disposed at (e.g., in or on) portions of the first and second folding portions FP1 and FP2 that are adjacent to the connecting portion CPP. The first organic insulating layer INS5, which is disposed on the first and second folding portions FP1 and FP2, may be extended to a region of the connecting portion CPP, and may be disposed at (e.g., in or on) the connecting portion CPP. In this case, the first organic insulating layer INS5 may be directly disposed on a top surface of the substrate SUB at (e.g., in or on) the connecting portion CPP. For example, the first organic insulating layer INS5 may cover side surfaces of the inorganic layers BFL and INS1-INS4 at (e.g., in or on) the connecting portion CPP.

The first and second data lines DLa and DLb may be disposed on the first organic insulating layer INS5. As shown in FIG. 9, the first data line DLa may be connected to the transistor TR disposed at (e.g., in or on) the first folding portion FP1. The second data line DLb may be connected to the transistor TR disposed at (e.g., in or on) the second folding portion FP2.

The second organic insulating layer INS6 may be disposed on the first organic insulating layer INS5, the first data line DLa, and the second data line DLb. The second organic insulating layer INS6 may be disposed on the transistor TR. The second organic insulating layer INS6 may cover the first and second data lines DLa and DLb.

The thin encapsulation layer TFE may be disposed on the second organic insulating layer INS6. The input-sensing part ISP may be disposed on the thin encapsulation layer TFE. The third organic insulating layer INS7 and the fourth organic insulating layer INS8 may be disposed on the first and second conductive patterns CTL1 and CTL2 of the input-sensing part ISP. The first and second conductive patterns CTL1 and CTL2 may not be disposed at (e.g., in or on) the connecting portion CPP.

The first organic insulating layer INS5, which is disposed at (e.g., in or on) the connecting portion CPP, may be in direct contact with the top surface of the substrate SUB at (e.g., in or on) the connecting portion CPP. The connection line CPD may be disposed on the first organic insulating layer INS5.

The connection line CPD and the second connection electrode CNE2 may be disposed at (e.g., in or on) the same layer as each other. When viewed in the second direction DR2, a portion of the connection line CPD may be connected to the first data line DLa. An opposite portion of the connection line CPD may be connected to the second data line DLb.

In other words, the connection line CPD may be extended in the second direction DR2 to connect the first data line DLa disposed at (e.g., in or on) the first folding portion FP1 to the second data line DLb disposed at (e.g., in or on) the second folding portion FP2. In an embodiment, the connection line CPD and the first and second data lines DLa and DLb connected thereto may be provided to form a single object. However, the present disclosure is not limited thereto, and in an embodiment, the connection line CPD may be disposed at (e.g., in or on) a layer different from that of the first and second data lines DLa and DLb, and may be connected to the first and second data lines DLa and DLb.

The second organic insulating layer INS6, which is disposed at (e.g., in or on) the first and second folding portions FP1 and FP2, may be extended to a region of the connecting portion CPP, and may be disposed at (e.g., in or on) the connecting portion CPP. The second organic insulating layer INS6 may be disposed on the first organic insulating layer INS5 and the connection line CPD. The second organic insulating layer INS6 may cover the connection line CPD.

The pixel definition layer PDL, the thin encapsulation layer TFE, the insulating layer TINS, and third and fourth organic insulating layers INS7 and INS8, which are disposed at (e.g., in or on) the first and second folding portions FP1 and FP2, may be extended to a region of the connecting portion CPP, and may be disposed at (e.g., in or on) the connecting portion CPP. Thus, the pixel definition layer PDL may be disposed on the second organic insulating layer INS6 at (e.g., in or on) the connecting portion CPP, and the thin encapsulation layer TFE may be disposed on the pixel definition layer PDL at (e.g., in or on) the connecting portion CPP. The base layer BS, the insulating layer TINS, the third organic insulating layer INS7, and the fourth organic insulating layer INS8 may be sequentially disposed on the thin encapsulation layer TFE at (e.g., in or on) the connecting portion CPP.

Because the inorganic layers BFL and INS1-INS4, which are harder than an organic insulating layer, are removed from a region of the connecting portion CPP, flexibility of the folding region FA may be increased. Thus, the folding region FA may have a reduced hardness, and thus, the folding region FA may be more easily folded. In addition, because the inorganic layers BFL and INS1-INS4 are removed, it may be possible to prevent or substantially prevent a crack from occurring in the inorganic layers BFL and INS1-INS4. In addition, the first and second data lines DLa and DLb at (e.g., in or on) the first and second folding portions FP1 and FP2 may be connected to each other by the connection line CPD disposed at (e.g., in or on) the connecting portion CPP.

Hereinafter, various structures of a display panel according to various embodiments of the present disclosure will be described in more detail with reference to various sectional views. Hereinafter, elements and features that are different from those described above with respect to the embodiment illustrated in FIG. 10 will be mainly described, and redundant description may not be repeated.

Figure 11:
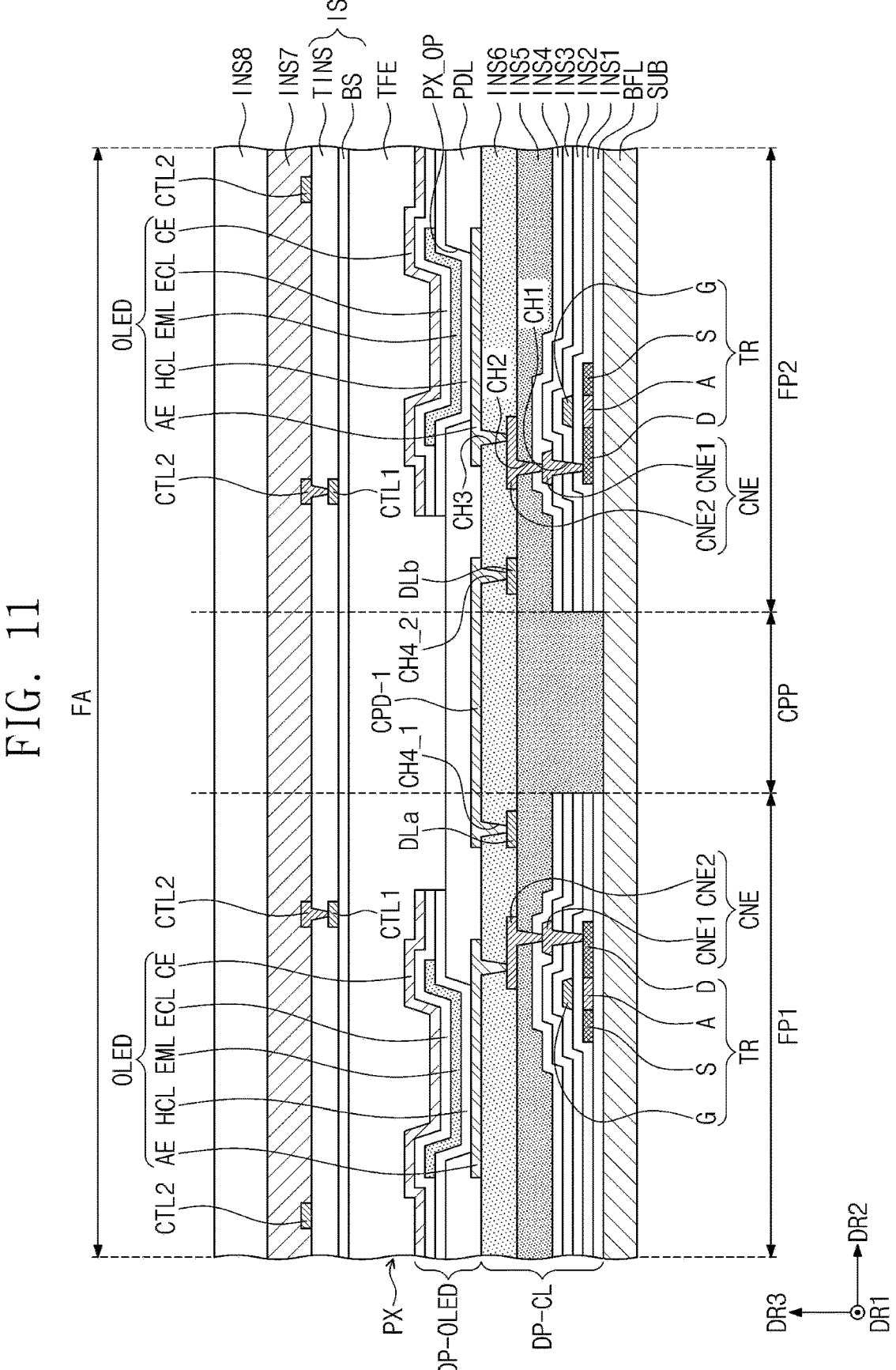
FIG. 11 is a sectional view illustrating a display panel according to an embodiment of the present disclosure.

FIG. 11 is a sectional view illustrating a display panel according to an embodiment of the present disclosure.

FIG. 11 illustrates a section (e.g., a cross-section) corresponding to the section illustrated in FIG. 10.

Except for the structure of a connection line CPD-1, the display panel illustrated in FIG. 11 may have the same or substantially the same structure as that of the display panel illustrated in FIG. 10. Thus, the structure of the connection line CPD-1 shown in FIG. 11 will be mainly described, and redundant description may not be repeated.

Referring to FIG. 11, the inorganic layers BFL and INS1-INS4 may be removed from the connecting portion CPP, and thus, the inorganic layers BFL and INS1-INS4 may not be disposed at (e.g., in or on) the connecting portion CPP. In addition, the transistors TR, the light-emitting devices OLED, and the first and second conductive patterns CTL1 and CTL2 may not be disposed at (e.g., in or on) the connecting portion CPP.

The connection line CPD-1 may be disposed on the second organic insulating layer INS6 at (e.g., in or on) the connection portion CPP. The connection line CPD-1 may be extended to a region of the first and second folding portions FP1 and FP2, and may be disposed on the first and second data lines DLa and DLb.

The connection line CPD-1 may be disposed at (e.g., in or on) a portion of the first folding portion FP1 adjacent to the connecting portion CPP, and a portion of the second folding portion FP2 adjacent to the connecting portion CPP. The connection line CPD-1 may be connected to the first and second data lines DLa and DLb. An end of the connection line CPD-1 may be disposed on the first data line DLa, and an opposite end of the connection line may be disposed on the second data line DLb.

The connection line CPD-1 may be connected to the first data line DLa and the second data line DLb through fourth contact holes CH4_1 and CH4_2 defined in (e.g., penetrating) the second organic insulating layer INS6 at (e.g., in or on) the first and second folding portions FP1 and FP2.

Because the inorganic layers BFL and INS1-INS4 are removed from the connecting portion CPP, the flexibility of the folding portion FP may be increased, and the folding portion FP may be more easily folded. In addition, the first and second data lines DLa and DLb may be connected to each other by the connection line CPD-1.

Figure 12:
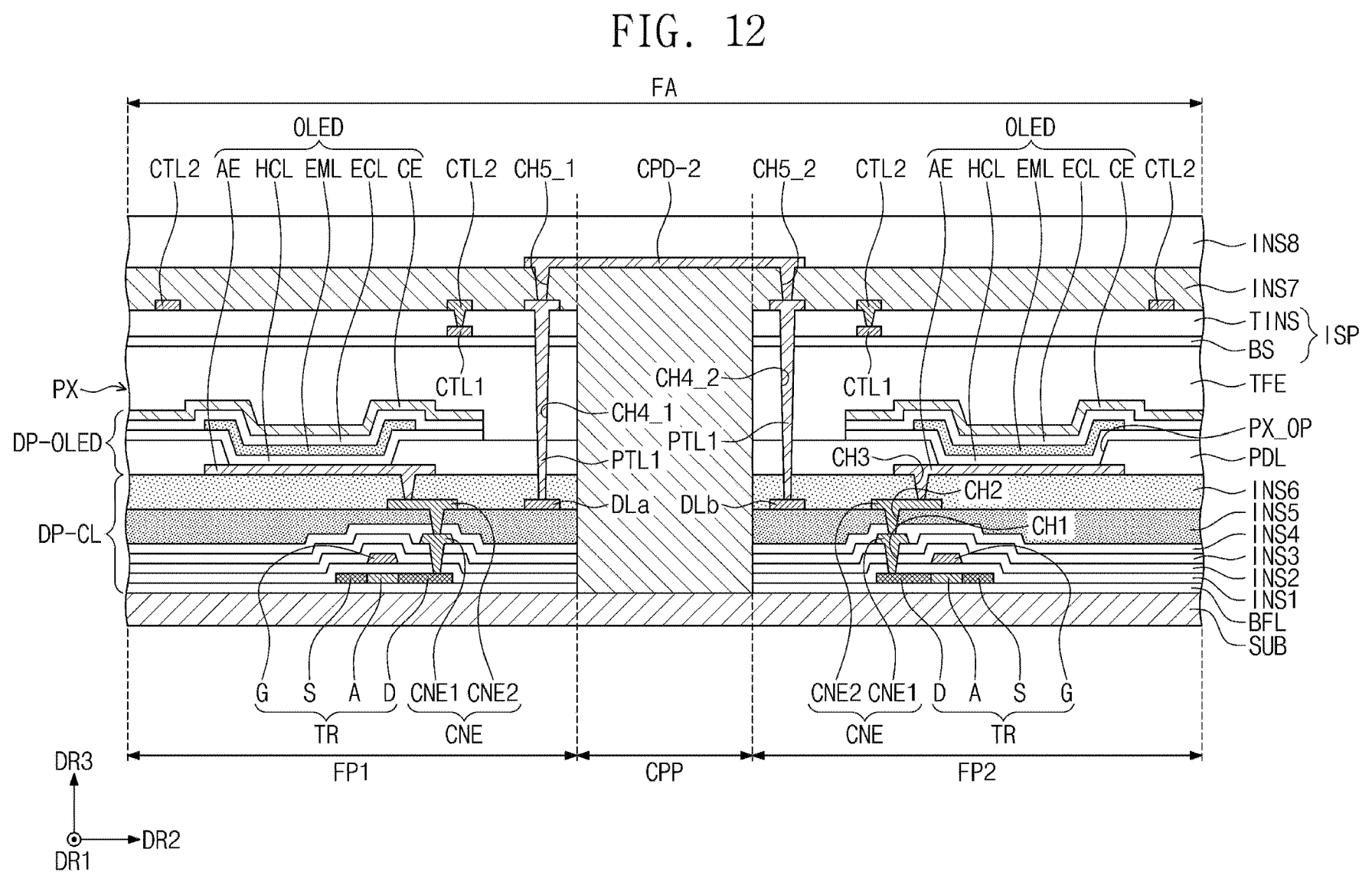

FIG. 12 is a sectional view illustrating a display panel according to an embodiment of the present disclosure.

Referring to FIG. 12, the inorganic layers BFL and INS1-INS4 may be removed from the connecting portion CPP, and the inorganic layers BFL and INS1-INS4 may not be disposed at (e.g., in or on) the connecting portion CPP. In addition, the transistors TR, the light-emitting devices OLED, and the first and second conductive patterns CTL1 and CTL2 may not be disposed at (e.g., in or on) the connecting portion CPP.

The second organic insulating layer INS6 may not be extended to a region of the connecting portion CPP. Thus, the second organic insulating layer INS6 may not be disposed at (e.g., in or on) the connecting portion CPP. The pixel definition layer PDL and the thin encapsulation layer TFE, which are disposed at (e.g., in or on) the first and second folding portions FP1 and FP2, may not be extended to a region of the connecting portion CPP. Thus, the pixel definition layer PDL and the thin encapsulation layer TFE may not be disposed at (e.g., in or on) the connecting portion CPP.

The base layer BS and the insulating layer TINS, which are disposed at (e.g., in or on) the first and second folding portions FP1 and FP2, may not be extended to a region of the connecting portion CPP. Thus, the base layer BS and the insulating layer TINS may not be disposed at (e.g., in or on) the connecting portion CPP.

The third organic insulating layer INS7, which is disposed at (e.g., in or on) the first and second folding portions FP1 and FP2, may be extended to a region of the connecting portion CPP, and may be disposed on the substrate SUB at (e.g., in or on) the connecting portion CPP. The third organic insulating layer INS7 may be disposed to be in direct contact with the substrate SUB at (e.g., in or on) the connecting portion CPP.

First pad electrodes PTL1 may be disposed at (e.g., in or on) the first and second folding portions FP1 and FP2. The first pad electrodes PTL1 may be disposed adjacent to the connecting portion CPP. The first pad electrodes PTL1 may be disposed at (e.g., in or on) the same layer as that of the second conductive pattern CTL2. The first pad electrodes PTL1 may be disposed on the first and second data lines DLa and DLb. The first pad electrodes PTL1 may be connected to the first and second data lines DLa and DLb. For example, the first pad electrodes PTL1 may be connected to the first and second data lines DLa and DLb through contact holes CH4_1 and CH4_2, which are defined in (e.g., penetrate) the second organic insulating layer INS6, the thin encapsulation layer TFE, the base layer BS, and the insulating layers TINS.

A connection line CPD-2 may be disposed at (e.g., in or on) the connecting portion CPP. The connection line CPD-2 may be disposed on the third organic insulating layer INS7. The fourth organic insulating layer INS8 may be disposed on the connection line CPD-2. The fourth organic insulating layer INS8 may be disposed on the third organic insulating layer INS7 to cover the connection line CPD-2. The connection line CPD-2 may be extended to regions at (e.g., in or on) portions of the first and second folding portions FP1 and FP2 that are adjacent to the connecting portion CPP, and may be disposed on the first pad electrodes PTL1.

The connection line CPD-2 may be connected to the first pad electrodes PTL1. For example, the connection line CPD-2 may be connected to the first pad electrodes PTL1 through contact holes CH5_1 and CH5_2, which are defined in (e.g., penetrate) the third organic insulating layer INS7. Thus, the first and second data lines DLa and DLb may be connected to each other through the connection line CPD-2, which is connected to the first pad electrodes PTL1.

Because the inorganic layers BFL and INS1-INS4, the first and second organic insulating layers INS5 and INS6, the pixel definition layer PDL, the thin encapsulation layer TFE, the base layer BS, and the insulating layer TINS are removed from a region of the connecting portion CPP, the flexibility of the folding portion FP may be increased, and thus, the folding portion FP may be more easily folded. In addition, the first and second data lines DLa and DLb may be connected to each other by the connection line CPD-2 and the first pad electrodes PTL1.

Figure 13:
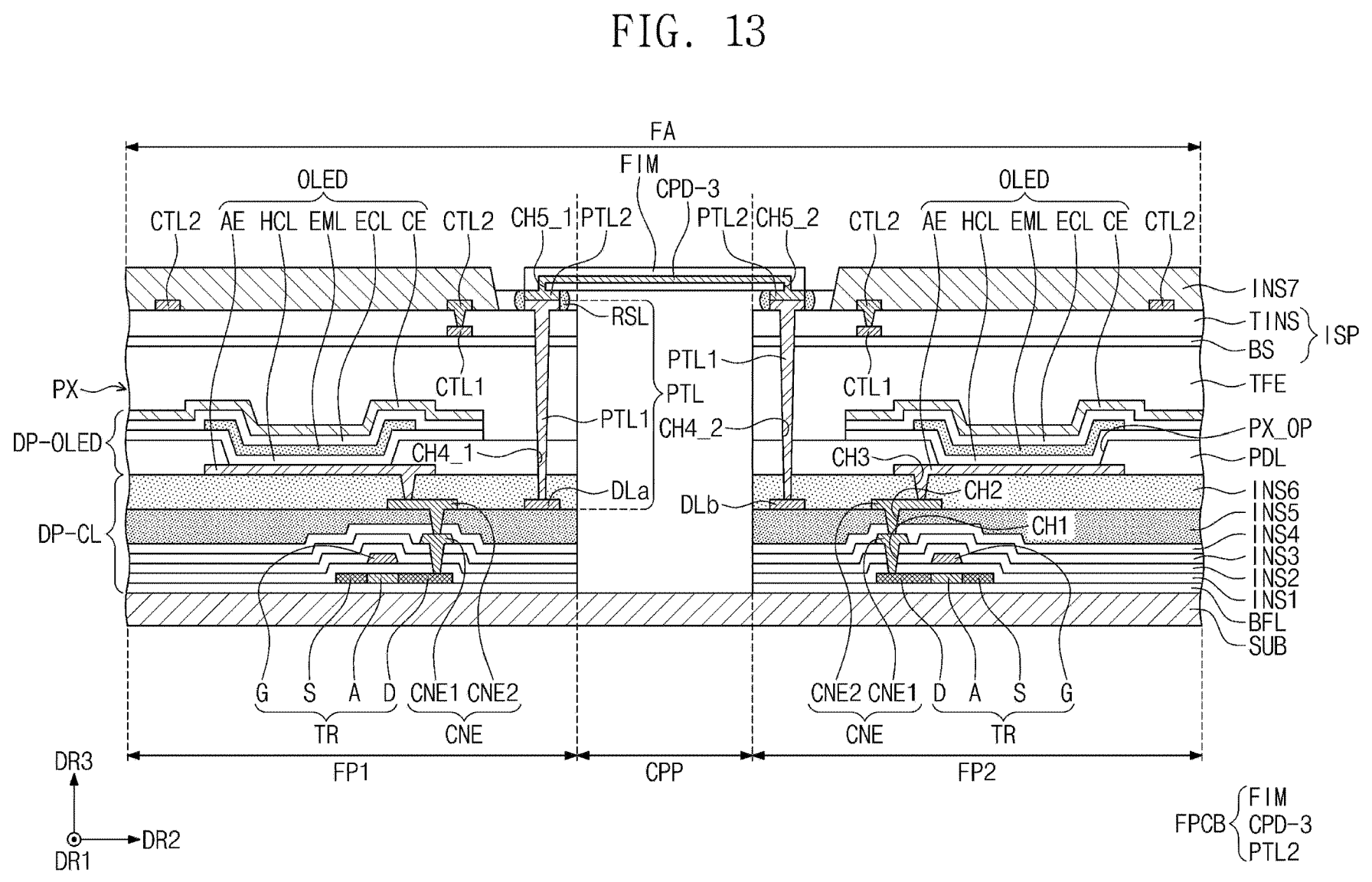

FIG. 13 is a sectional view illustrating a display panel according to an embodiment of the present disclosure.

Referring to FIG. 13, the inorganic layers BFL and INS1-INS4 may be removed from a region of the connecting portion CPP, and thus, the inorganic layers BFL and INS1-INS4 may not be disposed at (e.g., in or on) the connecting portion CPP. In addition, the transistors TR, the light-emitting devices OLED, and the first and second conductive patterns CTL1 and CTL2 may not be disposed at (e.g., in or on) the connecting portion CPP.

The first organic insulating layer INS5, the second organic insulating layer INS6, the pixel definition layer PDL, the thin encapsulation layer TFE, the base layer BS, the insulating layer TINS, and the third organic insulating layer INS7 may not be disposed at (e.g., in or on) the connecting portion CPP. The fourth organic insulating layer INS8 illustrated in FIG. 12 may not be disposed on the third organic insulating layer INS7. The first pad electrodes PTL1 may have the same or substantially the same structure as that of the first pad electrodes PTL1 illustrated in FIG. 12.

The third organic insulating layer INS7 may not be disposed at (e.g., in or on) regions of the first and second folding portions FP1 and FP2 that are adjacent to the connecting portion CPP. Because a portion of the third organic insulating layer INS7 adjacent to the connecting portion CPP is removed, the first pad electrodes PTL1 may be exposed to the outside of the third organic insulating layer INS7 in the third direction DR3 (e.g., in an upward direction).

A flexible circuit film FPCB may be disposed at (e.g., in or on) the connecting portion CPP, and at (e.g., in or on) portions of the first and second folding portions FP1 and FP2, which are adjacent to the connecting portion CPP. The flexible circuit film FPCB may be disposed on the input-sensing part ISP.

The flexible circuit film FPCB may include a flexible film FIM, a connection line CPD-3 disposed in the flexible film FIM, and second pad electrodes PTL2 disposed on a bottom surface of the flexible film FIM. The second pad electrodes PTL2 may be connected to the connection line CPD-3 through contact holes CH5_1 and CH5_2, which are defined in (e.g., penetrate) the flexible film FIM.

The flexible circuit film FPCB may be disposed on the second pad electrodes PTL2. The connection line CPD-3 may be connected to the first pad electrodes PTL1. For example, the second pad electrodes PTL2, which are connected to the connection line CPD-3, may be connected to the first pad electrodes PTL1, and thus, the connection line CPD-3 may be connected to the first pad electrodes PTL1.

As described above, the first and second pad electrodes PTL1 and PTL2 may be connected to the first and second data lines DLa and DLb. Thus, the connection line CPD-3 may be connected to the first and second data lines DLa and DLb through the second pad electrodes PTL2 and the first pad electrodes PTL1.

A resin layer RSL may be disposed around (e.g., adjacent to) the first and second pad electrodes PTL1 and PTL2. For example, the resin layer RSL may be disposed to surround around peripheries of the first and second pad electrodes PTL1 and PTL2. The resin layer RSL may prevent or substantially prevent the first and second pad electrodes PTL1 and PTL2 from being exposed to the outside, and may protect the first and second pad electrodes PTL1 and PTL2.

Because the inorganic layers BFL and INS1-INS4, the first and second organic insulating layers INS5 and INS6, the thin encapsulation layer TFE, the base layer BS, the insulating layer TINS, and the third organic insulating layer INS7 are removed from the connecting portion CPP, the flexibility of the folding portion FP may be increased, and thus, the folding portion FP may be more easily folded. In addition, the first and second data lines DLa and DLb may be connected to each other by the connection line CPD-3 and the first and second pad electrodes PTL1 and PTL2.

Figure 14:
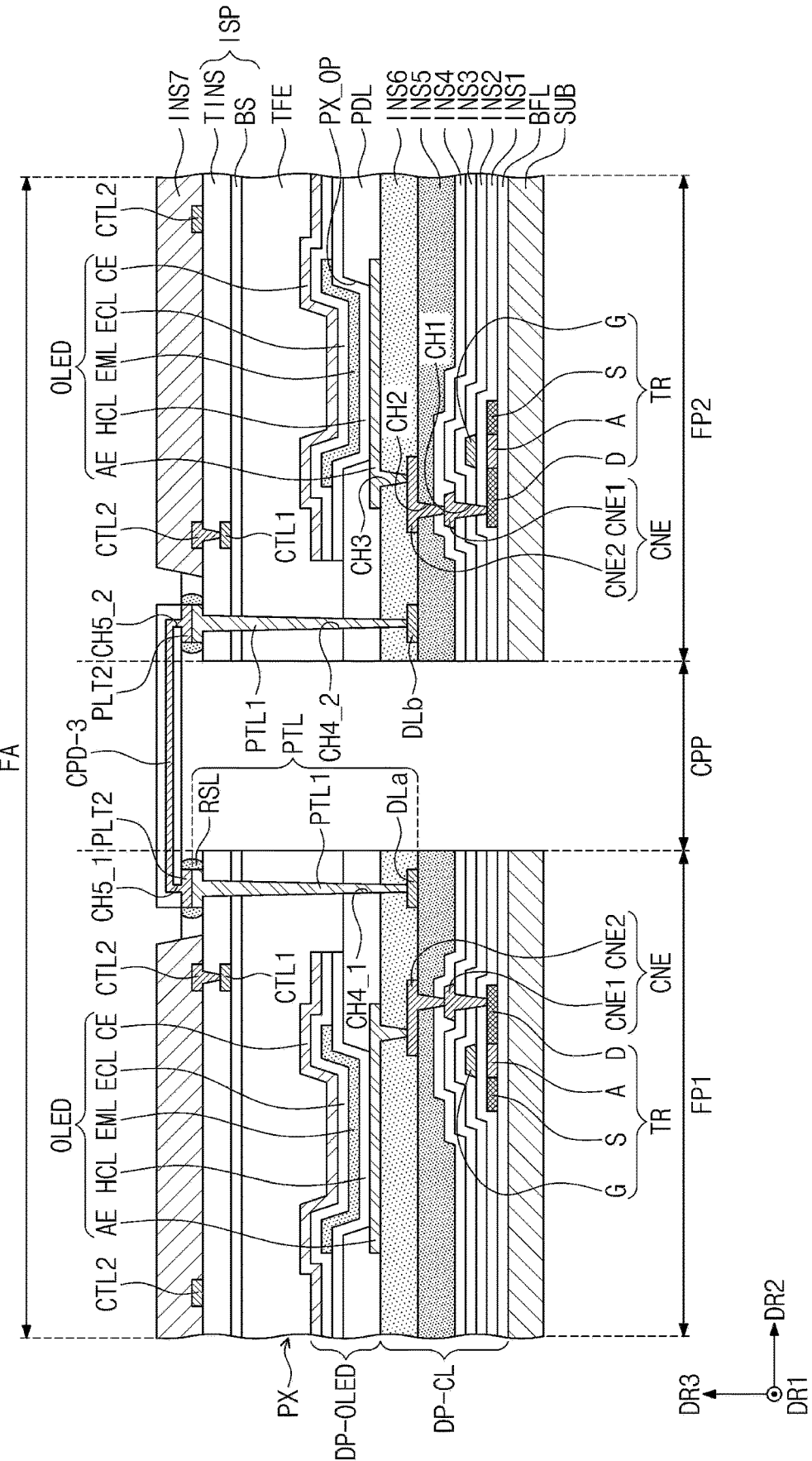
FIG. 14 is a sectional view illustrating a display panel according to an embodiment of the present disclosure.

FIG. 14 is a sectional view illustrating a display panel according to an embodiment of the present disclosure.

Referring to FIG. 14, unlike the structure illustrated in FIG. 13, the connecting portion CPP illustrated in FIG. 13 may be removed from the structure illustrated in FIG. 14. In other words, the substrate SUB may be cut at the connecting portion CPP. The other remaining elements may be the same or substantially the same as those described above with reference to the embodiment illustrated in FIG. 13, and thus, redundant description thereof may not be repeated. Because the connecting portion CPP is removed, flexibility of the folding portion FP may be increased, and thus, the folding portion FP may be more easily folded.

Figure 15:
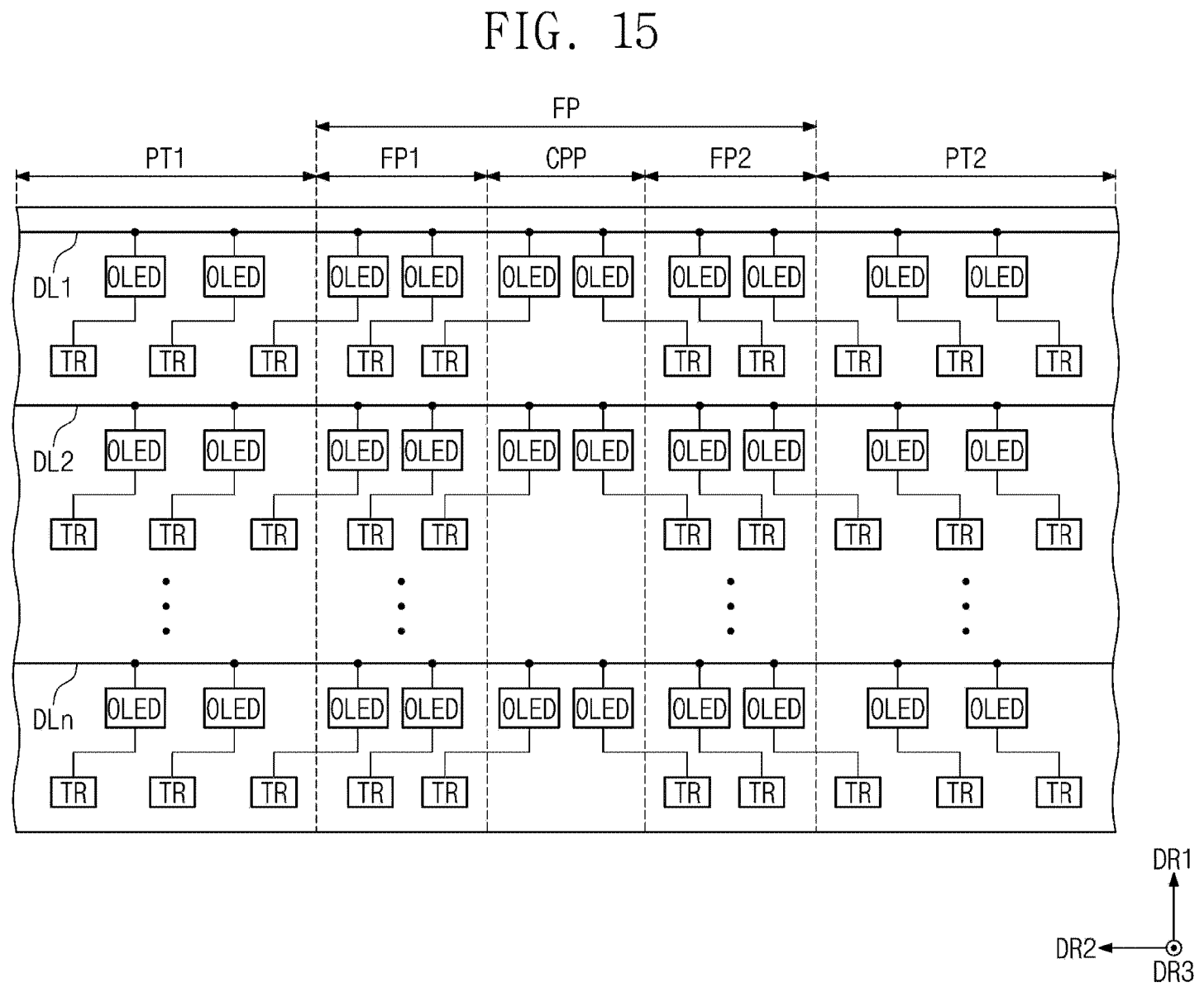

FIG. 15 is an enlarged view illustrating a substrate according to an embodiment of the present disclosure. FIG. 15 is an enlarged view illustrating another example of the region AA3 of FIG. 7.

Hereinafter, elements and features that are different from those described above with reference to FIG. 9 will be described in more detail with reference to FIG. 15, and redundant description may not be repeated.

Referring to FIGS. 5 and 15, the substrate SUB may include the first portion PT1, the second portion PT2, and the folding portion FP. As described above with reference to FIG. 5, the first portion PT1 may overlap with the first non-folding region NFA1, the second portion PT2 may overlap with the second non-folding region NFA2, and the folding portion FP may overlap with the folding region FA.

The light-emitting devices OLED, the transistors TR, and the data lines DL1-DLn may be disposed at (e.g., in or on) the first and second portions PT1 and PT2. The data lines DL1-DLn may be extended in the second direction DR2 from the first portion PT1 to the second portion PT2, and may be arranged along the first direction DR1.

The light-emitting devices OLED, the transistors TR, and the data lines DL1-DLn may be disposed at (e.g., in or on)

the first and second folding portions FP1 and FP2. The data lines DL1-DLn may be extended in the second direction DR2 from the first folding portion FP1 to the second folding portion FP2, and may be arranged along the first direction DR1.

The light-emitting devices OLED and the data lines DL1-DLn may be disposed at (e.g., in or on) the connecting portion CPP. The data lines DL1-DLn may be extended in the second direction DR2, and may be arranged along the first direction DR1 at (e.g., in or on) the connecting portion CPP.

The number of the transistors TR disposed at (e.g., in or on) the first and second portions PT1 and PT2 and the first and second folding portions FP1 and FP2 may be greater than the number of the light-emitting devices OLED disposed at (e.g., in or on) the first and second portions PT1 and PT2 and the first and second folding portions FP1 and FP2.

The transistors TR may not be disposed at (e.g., in or on) the connecting portion CPP. The light-emitting devices OLED, which are disposed at (e.g., in or on) the first and second portions PT1 and PT2, the first and second folding portions FP1 and FP2, and the connecting portion CPP, may be respectively connected to the transistors TR disposed at (e.g., in or on) the first and second portions PT1 and PT2 and the first and second folding portions FP1 and FP2. The transistors TR may not be disposed at (e.g., in or on) the connecting portion CPP, and the transistors TR to be connected to the light-emitting devices OLED disposed at (e.g., in or on) the connecting portion CPP may be disposed at (e.g., in or on) the first and second folding portions FP1 and FP2.

Figure 16:
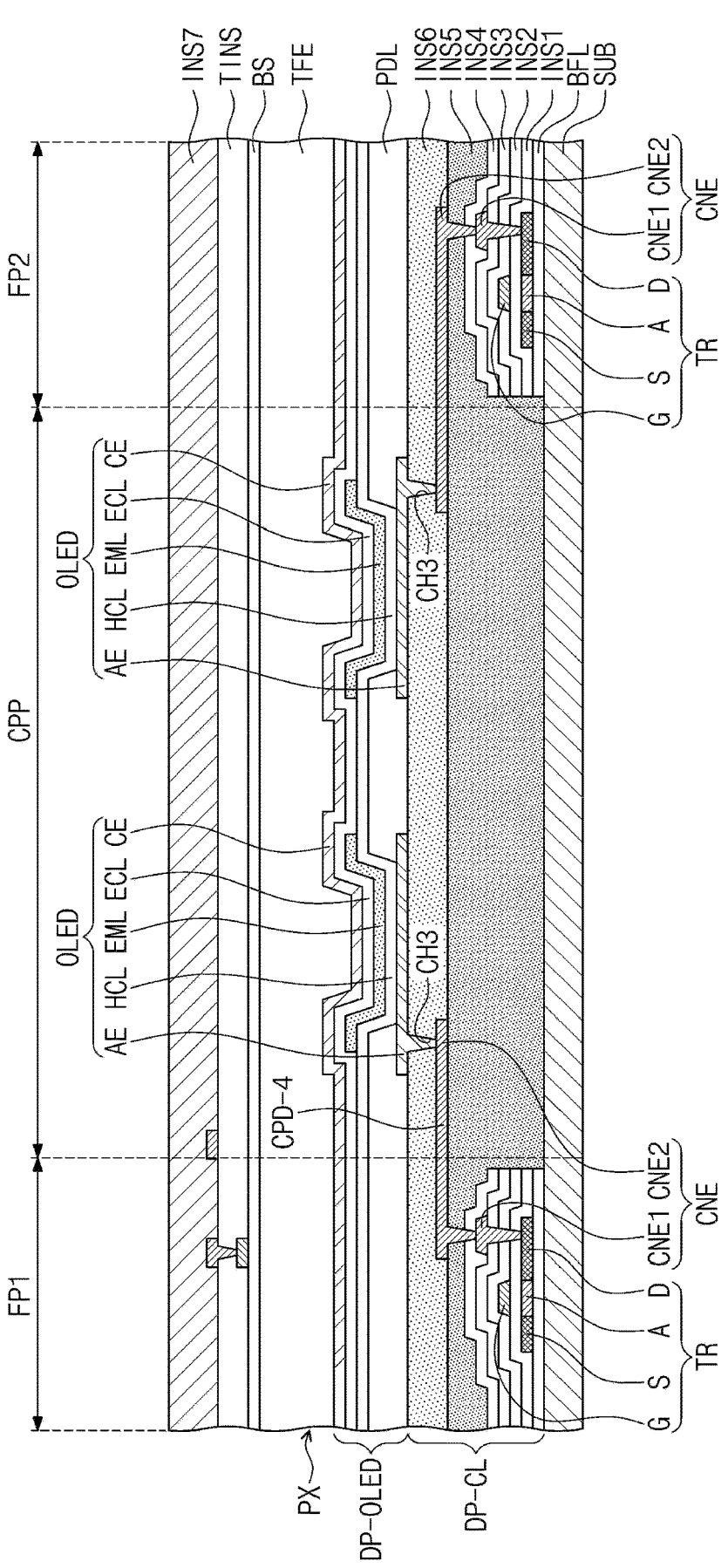
FIG. 16 is a sectional view illustrating pixels of a connecting portion, and first and second folding portions adjacent to the connecting portion shown in FIG. 15.

FIG. 16 is a sectional view illustrating pixels of a connecting portion, and first and second folding portions adjacent to the connecting portion shown in FIG. 15. Referring to FIG. 16, the pixels PX, the thin encapsulation layer TFE, the input-sensing part ISP, the third organic insulating layer INS7, and the fourth organic insulating layer INS8, which are provided at (e.g., in or on) the first and second folding portions FP1 and FP2, may be the same or substantially the same as the pixels PX, the thin encapsulation layer TFE, the input-sensing part ISP, the third organic insulating layer INS7, and fourth organic insulating layer INS8 described above with reference to the embodiment illustrated in FIG. 10. In some embodiments, the fourth organic insulating layer INS8 illustrated in the embodiment of FIG. 10 may be omitted from the embodiment illustrated in FIG. 16. Thus, hereinafter, the structure of the folding portion FP will be mainly described in more detail, and redundant description of other elements and features may be briefly provided, or may not be repeated.

The inorganic layers BFL and INS1-INS4 may be disposed on the substrate SUB. The inorganic layers BFL and INS1-INS4 may be disposed at (e.g., in or on) the first and second folding portions FP1 and FP2. The transistors TR and the light-emitting devices OLED may be disposed at (e.g., in or on) the first and second folding portions FP1 and FP2. The first to fourth insulating layers INS1-INS4 may cover the transistors TR. The first organic insulating layer INS5 may be disposed on the inorganic layers BFL and INS1-INS4 and the transistors TR.

The inorganic layers BFL and INS1-INS4 may not be disposed at (e.g., in or on) a portion of the folding portion FP. For example, the inorganic layers BFL and INS1-INS4 may not be disposed at (e.g., in or on) the connecting portion CPP. The first organic insulating layer INS5, which is disposed at (e.g., in or on) the first and second folding portions FP1 and FP2, may be extended to a region of the connecting portion CPP, and may be disposed at (e.g., in or on) the connecting portion CPP. In this case, the first organic insulating layer INS5 may be directly disposed on the top surface of the substrate SUB at (e.g., in or on) the connecting portion CPP.

Connection lines CPD-4 may be disposed on the first organic insulating layer INS5. The connection lines CPD-4 may be formed to be extended from the second connection electrodes CNE2 that are connected to the transistors TR disposed at (e.g., in or on) the first and second folding portions FP1 and FP2. In an embodiment, the second connection electrode CNE2 and the connection line CPD-4 may form or substantially form a single object. Portions of the second connection electrodes CNE2, which are extended to the connecting portion CPP, may be defined as the connection lines CPD-4.

The transistors TR may not be disposed at (e.g., in or on) the connecting portion CPP. The light-emitting devices OLED may be disposed at (e.g., in or on) the connecting portion CPP. The light-emitting devices OLED, which are disposed at (e.g., in or on) the connecting portion CPP, may be connected to corresponding ones of the transistors TR disposed at (e.g., in or on) the first and second folding portion FP1 and FP2. For example, the first electrodes AE of the light-emitting devices OLED may be connected to the connection lines CPD-4 through third contact holes CH3 defined in the second organic insulating layer INS6.

Because the inorganic layers BFL and INS1-INS4, which are harder than an organic insulating layer, are removed from a region of the connecting portion CPP, flexibility of the folding region FA may be increased. Thus, the folding region FA may have a reduced hardness, and thus, the folding region FA may be more easily folded. In addition, because the inorganic layers are removed, it may be possible to prevent or substantially prevent a crack from occurring in the inorganic layers. Furthermore, the light-emitting devices OLED may be connected to the transistors TR, which are provided at (e.g., in or on) the first and second folding portions FP1 and FP2, by the connection lines CPD-4 disposed at (e.g., in or on) the connecting portion CPP.

Figure 17:
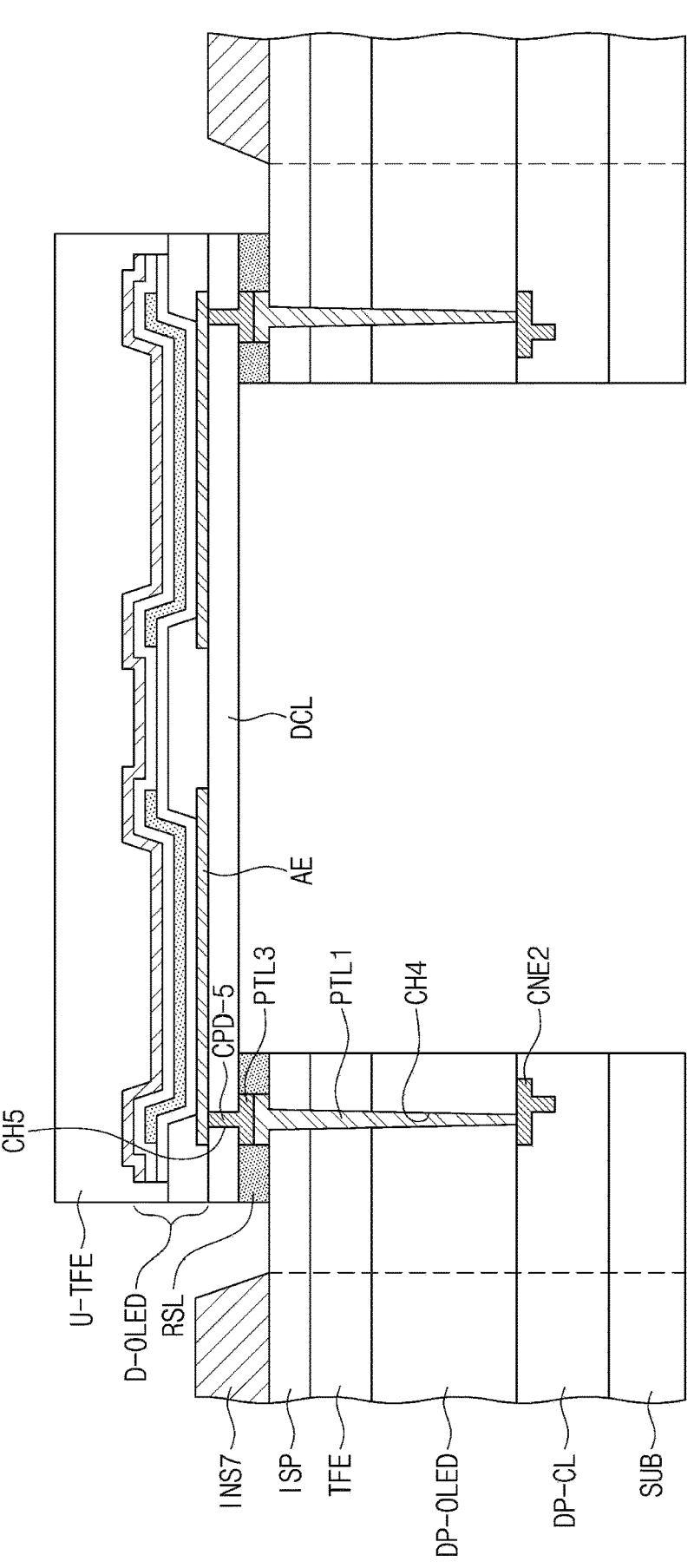
FIG. 17 is a sectional view illustrating a display panel according to an embodiment of the present disclosure.

FIG. 17 is a sectional view illustrating a display panel according to an embodiment of the present disclosure.

The display panel of FIG. 17 may have the same or substantially the same structure as that of FIG. 14, except for a connection line CPD-5. Thus, the connection line CPD-5 of FIG. 17 will be mainly described in more detail below, and redundant description may not be repeated.

For convenience of illustration, the transistors TR are not shown in FIG. 14, and a portion of the second connection electrode CNE2 is shown. Further, for convenience of illustration, in FIG. 14, each of the circuit device layer DP-CL, the display device layer DP-OLED, and the thin encapsulation layer TFE is illustrated as a single layer. Furthermore, in FIG. 14, the insulating layer TINS, the base layer BS, and the input-sensing part ISP is illustrated as a single layer (e.g., labeled with ISP).

The connecting portion CPP may be removed from the structure illustrated in FIG. 17. In other words, the substrate SUB may be cut at the connecting portion CPP. The inorganic layers BFL and INS1-INS4, the transistors TR, the first and second conductive patterns CTL1 and CTL2, the first organic insulating layer INS5, the second organic insulating layer INS6, the pixel definition layer PDL, the thin encapsulation layer TFE, the base layer BS, the insulating layer TINS, and the third organic insulating layer INS7 may not be disposed at (e.g., in or on) the connecting portion CPP. The first pad electrodes PTL1 may be provided to have the same structure or substantially the same structure as those of the embodiment illustrated in FIG. 14.

The third organic insulating layer INS7 may not be disposed at (e.g., in or on) regions of the first and second folding portions FP1 and FP2 that are adjacent to the connecting portion CPP. Because a portion of the third organic insulating layer INS7 that is adjacent to the connecting portion CPP is removed, the first pad electrodes PTL1 may be exposed to the outside of the third organic insulating layer INS7 in the third direction DR3 (e.g., in an upward direction).

A dummy substrate DCL may be disposed on regions at (e.g., in or on) the connecting portion CPP, and the first and second folding portions FP1 and FP2 adjacent to the connecting portion CPP. The dummy substrate DCL may be disposed on the insulating layer TINS and the base layer BS.

Connection pads may be disposed in contact holes CH5 defined in (e.g., penetrating) the dummy substrate DCL. The connection pads may be defined as the connection line CPD-5 for connecting the light-emitting device OLED to third pad electrodes PTL3. The connection pad may be disposed in the contact hole CH5, and may be extended to a bottom surface of the dummy substrate DCL. The connection pads may be disposed on the bottom surface of the dummy substrate DCL.

The connection line CPD-5 may be connected to the first electrode AE of the light-emitting devices D-OLED disposed on the dummy substrate DCL. The third pad electrodes PTL3 may be disposed on the first pad electrodes PTL1. The third pad electrodes PTL3 may be connected to the first pad electrodes PTL1. For example, the third pad electrodes PTL3, which are connected to the connection line CPD-5, may be connected to the first pad electrodes PTL1, and thus, the connection line CPD-5 may be connected to the first pad electrodes PTL1.

The pad electrodes PTL1 and PTL3 may be connected to the transistors TR disposed at (e.g., in or on) the first and second folding portions FP1 and FP2. Thus, the connection line CPD-5 may be connected to the transistors TR, which are disposed at (e.g., in or on) the first and second folding portions FP1 and FP2, through the first and third pad electrodes PTL1 and PTL3.

The resin layer RSL may be disposed around (e.g., adjacent to) the first and third pad electrodes PTL1 and PTL3. The resin layer RSL may prevent or substantially prevent the first and third pad electrodes PTL1 and PTL3 from being exposed to the outside, and may protect the first and third pad electrodes PTL1 and PTL3.

The light-emitting devices D-OLED may be disposed on the dummy substrate DCL. A plurality of the light-emitting devices D-OLED may be disposed on the dummy substrate DCL. An upper thin encapsulation layer U-TFE may be disposed on the light-emitting devices D-OLED. The upper thin encapsulation layer U-TFE may include a plurality of layers, but for convenience of illustration, is illustrated as a single layer in FIG. 17.

Because the inorganic layers BFL and INS1-INS4, the first and second organic insulating layers INS5 and INS6, the thin encapsulation layer TFE, the base layer BS, the insulating layer TINS, and the third organic insulating layer INS7 are removed from the connecting portion CPP, the flexibility of the folding portion FP may be increased, and thus, the folding portion FP may be more easily folded. In addition, the light-emitting devices D-OLED on the dummy substrate DCL and the transistors TR at (e.g., in or on) the first and second folding portions FP1 and FP2 may be connected to each other by the connection line CPD-5 and the pad electrodes PTL1 and PTL3.

Figure 18:
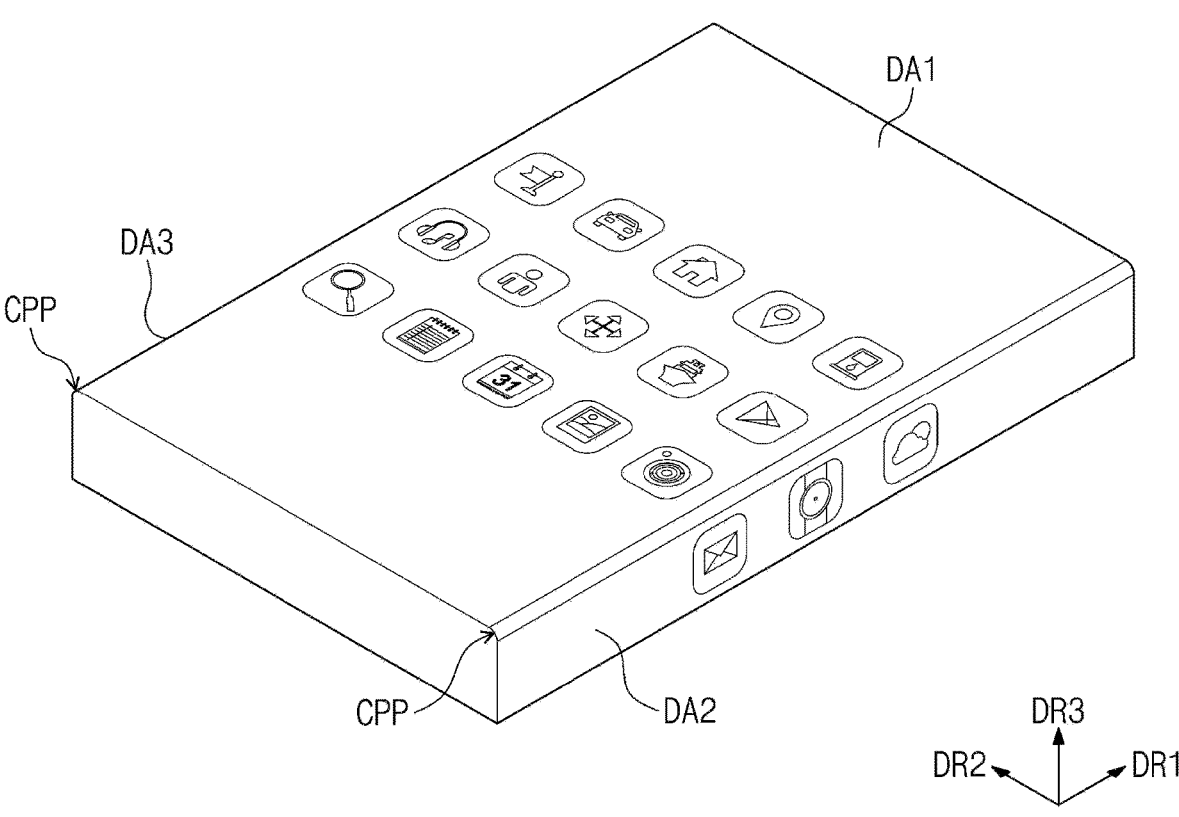
FIG. 18 is a perspective view illustrating a display device according to an embodiment of the present disclosure.

FIG. 18 is a perspective view illustrating a display device according to an embodiment of the present disclosure.

Referring to FIG. 18, the display device ED may include a plurality of display surfaces. For example, the display device ED of FIG. 18 may include a first display surface DA1, a second display surface DA2, and a third display surface DA3. The first display surface DA1 may have a flat or substantially flat surface or a plane defined by the first and second directions DR1 and DR2. The second and third display surfaces DA2 and DA3 may have a flat or substantially flat surface or a plane defined by the first and third directions DR1 and DR3.

The second and third display surfaces DA2 and DA3 may be display surfaces that are opposite to each other in the second direction DR2. The first, second, and third display surfaces DA1, DA2, and DA3 may be used to display an image. The first, second, and third display surfaces DA1, DA2, and DA3 may be configured to have the same or substantially the same features as those of the display surface DS of FIG. 1, and thus, redundant description thereof may not be repeated. The connecting portion CPP may be disposed between the first and second display surfaces DA1 and DA2. In addition, the connecting portion CPP may be disposed between the first and third display surfaces DA1 and DA3.

Figure 19:
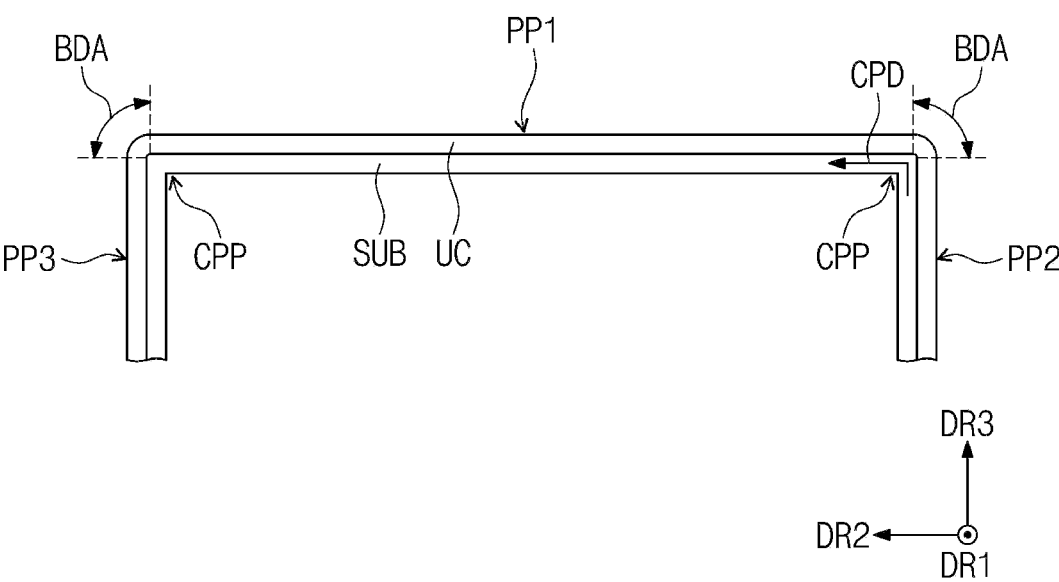
FIG. 19 is a diagram illustrating a display panel viewed in a first direction of the display device of FIG. 18.

FIG. 19 is a diagram illustrating a display panel viewed in the first direction of the display device of FIG. 18.

An upper structure UC shown in FIG. 19 may correspond to the structure from the buffer layer BFL to the fourth organic insulating layer INS8 of FIG. 10.

Referring to FIG. 19, the display panel DP may include a first flat portion PP1, a second flat portion PP2, a third flat portion PP3, and boundary portions BDA. The first flat portion PP1 may have a plane (e.g., a flat or substantially flat surface) defined by the first and second directions DR1 and DR2. The second and third flat portions PP2 and PP3 may have a plane defined by the first and third directions DR1 and DR3, and may face away from each other. The boundary portions BDA may be disposed between the first and second flat portions PP1 and PP2, and between the first and third flat portions PP1 and PP3. The first, second, and third display surfaces DA1, DA2, and DA3 shown in FIG. 18 may be defined as top surfaces of the first, second, and third flat portions PP1, PP2, and PP3 shown in FIG. 19.

A stacking structure of the display panel DP may include the substrate SUB and the upper structure UC. The substrate SUB may be perpendicularly or substantially perpendicularly bent at the connecting portions CPP. The upper structure UC on the connecting portion CPP of the substrate SUB corresponding to the boundary portions BDA may have the same or substantially the same structure as that on the connecting portion CPP shown in FIG. 10. In other words, in the structure of FIG. 19, the inorganic layers BFL and INS1-INS4 may not be disposed at (e.g., in or on) the connecting portions CPP, as shown in FIG. 10.

In addition, as shown in FIG. 10, the connection line CPD may be disposed at (e.g., in or on) the connecting portion CPP, and thus, the first and second data lines DLa and DLb are connected to each other by the connection line CPD.

Because, similar to the structure of the connecting portion CPP illustrated in FIG. 10, the upper structure UC at (e.g., in or on) the connecting portion CPP does not include the inorganic layers BFL and INS1-INS4 that are harder than the organic insulating layers INS5-INS7, portions of the upper structure UC on the connecting portions may have improved flexibility. Thus, the portions of the upper structure UC on the connecting portions CPP may be more easily bent.

According to one or more embodiments of the present disclosure, inorganic layers may be removed from a connecting portion overlapping with a portion of a folding region of a display device, and thus, it may be possible to prevent or substantially prevent a crack from occurring in the inorganic layers, and/or damage to the folding region. In addition, it may be possible to increase the flexibility of the folding region, and thus, a folding operation of the folding region may be easily performed. Furthermore, interconnection lines may be disposed at (e.g., in or on) a first non-folding region and a second non-folding region, which are disposed with the connecting portion interposed therebetween, and the interconnection lines may be connected to one another by connection lines disposed at (e.g., in or on) the connecting portion.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. An electronic device comprising:
a substrate comprising a first portion, a second portion, and a folding portion between the first and second portions;
a plurality of transistors on the substrate, and located on at least the first and second portions;
a plurality of inorganic insulating layers extending on the first and second portions to cover a semiconductor layer and a gate of the transistors;
a plurality of light-emitting devices connected to the transistors; and
a connection line on the folding portion,
wherein the inorganic insulating layers are not located on at least a part of the folding portion, and
wherein, in the at least the part of the folding portion, no inorganic material contacts the substrate.

2. The electronic device of claim 1, wherein the folding portion is configured to be folded and unfolded.

3. A display device comprising:
a substrate comprising a first portion, a second portion, and a folding portion between the first and second portions;
a plurality of transistors on the substrate, and located on at least the first and second portions;
a plurality of inorganic insulating layers extending on the first and second portions to cover a semiconductor layer and a gate of the transistors;

a plurality of light-emitting devices connected to the transistors; and a connection line on the folding portion, wherein the inorganic insulating layers are not located on at least a part of the folding portion, wherein the folding portion comprises:

a first folding portion adjacent to the first portion;

a second folding portion adjacent to the second portion; and a connecting portion between the first and second folding portions, wherein a transistor from among the plurality of transistors and a light-emitting device from among the plurality of light-emitting devices are located on the first and second folding portions, and wherein the connection line is located on the connecting portion.

4. The display device of claim 3, wherein the inorganic insulating layers are located on the first and second folding portions, and are not located on the connecting portion.

5. The display device of claim 3, wherein the plurality of transistors and the plurality of light-emitting devices are not located on the connecting portion.

6. The display device of claim 3, wherein the connecting portion has the greatest curvature when the folding portion is folded.

7. The display device of claim 3, further comprising:

a first data line connected to the transistors from among the plurality of transistors that are located on the first portion and the first folding portion; and a second data line connected to the transistors from among the plurality of transistors that are located on the second portion and the second folding portion, wherein the first and second data lines are electrically connected to each other through the connection line.

8. The display device of claim 7, further comprising:

a first organic insulating layer on the transistors located on each of the first and second portions and the first and second folding portions;

a connection electrode on the first organic insulating layer; and a second organic insulating layer on the connection electrode, wherein the connection electrode is connected to a transistor from among the plurality of transistors and a light-emitting device from among the plurality of light-emitting devices.

9. The display device of claim 8, wherein the first and second organic insulating layers are located on the connecting portion, and wherein the first organic insulating layer is in direct contact with a top surface of the substrate at the connecting portion.

10. The display device of claim 8, wherein the first and second data lines and the connection line are located on the first organic insulating layer to form a single line, and the second organic insulating layer is on the connection line.

11. The display device of claim 8, wherein each of the light-emitting devices comprises:

a first electrode on and connected to a corresponding transistor from among the plurality of transistors;

a second electrode on the first electrode; and an emission layer between the first electrode and the second electrode, wherein the connection line and the first electrode are located at the same layer as each other on the second organic insulating layer.

12. The display device of claim 3, wherein the connection line is located on a portion of the first folding portion adjacent to the connecting portion, and on a portion of the second folding portion adjacent to the connecting portion, and wherein the connection line is connected to first and second data lines.

13. The display device of claim 3, further comprising:

an input-sensing part on the light-emitting device, the input-sensing part comprising:

a first conductive pattern; and a second conductive pattern on the first conductive pattern;

a first data line on a portion of the first folding portion;

a second data line on a portion of the second folding portion; and pad electrodes on and connected to the first and second data lines on the first and second folding portions, the pad electrodes being located at the same layer as that of the second conductive pattern, wherein the connection line is located on and connected to the pad electrodes.

14. The display device of claim 13, further comprising:

a third organic insulating layer on the second conductive pattern; and a fourth organic insulating layer on the third organic insulating layer, wherein the connection line is located on the third organic insulating layer, and wherein the fourth organic insulating layer is located on the connection line.

15. The display device of claim 14, wherein the third organic insulating layer is in direct contact with a top surface of the substrate at the connecting portion.

16. The display device of claim 13, further comprising a flexible film including the connection line, wherein the flexible film is located on the pad electrodes, and wherein the connection line is connected to the pad electrodes.

17. The display device of claim 16, wherein the substrate is cut at the connecting portion.

18. The display device of claim 3, wherein a light emitting device from among the light-emitting devices is located on the connecting portion, and the light-emitting device located on the connecting portion is connected to a transistor from among the transistors located on one of the first or second folding portions.

19. The display device of claim 3, further comprising:

a dummy substrate on the connecting portion; and a dummy light-emitting device on the dummy substrate, wherein the substrate is cut at the connecting portion, and wherein the dummy light-emitting device is connected to a transistor from among the transistors located on one of the first or second folding portions by the connection line.

20. The display device of claim 3, wherein the substrate is perpendicularly bent at the connecting portion.

* * * * *